SEQUENTIAL GATED AUTOMATIC GAIN CONTROL CIRCUIT

Filed May 26, 1955 4 Sheets-Sheet 1

INVENTOR.
MARCUS C. ELIASON
BY
Henry Heyman
ATTORNEY

Dec. 2, 1958 M. C. ELIASON 2,863,046

SEQUENTIAL GATED AUTOMATIC GAIN CONTROL CIRCUIT

Filed May 26, 1955 4 Sheets-Sheet 2

INVENTOR.
MARCUS C. ELIASON
BY
Henry Heyman
ATTORNEY

SEQUENTIAL GATED AUTOMATIC GAIN CONTROL CIRCUIT

Filed May 26, 1955 4 Sheets-Sheet 3

INVENTOR.
MARCUS C. ELIASON

BY Henry Heyman
ATTORNEY

INVENTOR.
MARCUS C. ELIASON
BY
Henry Heyman
ATTORNEY

United States Patent Office 2,863,046 Patented Dec. 2, 1958

2,863,046

SEQUENTIAL GATED AUTOMATIC GAIN CONTROL CIRCUIT

Marcus C. Eliason, Packanack Lake, N. J., assignor to Hughes Aircraft Company, Culver City, Calif., a corporation of Delaware Application May 26, 1955, Serial No. 511,148

15 Claims. (Cl. 250—20)

This invention relates to automatic gain control (AGC) systems, and more particularly to a sequential AGC system (SAGC) adapted to maintain substantially constant output signal amplitude in a radio receiving system subject to pulse type input signals of varying amplitude received from two or more co-channel transmitters.

In numerous applications of radio receivers it is desirable to maintain constant the amplitude of output signals to be applied to auxiliary equipment regardless of unavoidable variations in the amplitude of the input signals. This involves controlling the gain of amplification stages in the receiver in a manner whereby the overall receiver gain may be elevated during the reception of weak input signals and maintained below the blocking level during the reception of very strong signals. In addition to amplifier gain compensation for input signal amplitude variations, it is desirable to compensate for changes in signal strength which may occur in the amplifier stages resulting from unavoidable tube and associated circuitry characteristic shifts.

In typical apparatus of this class it is conventional to incorporate structure for developing a biasing voltage that is applied to variable-gain amplification stages. This voltage is frequently supplied by an automatic gain controy system utilizing the principles of detecting and filtering the output of an intermediate frequency (I. F.) amplifier stage thereby deriving a unilateral voltage proportional to the output signal yielded by the detector. This voltage is fed back to one or more of the I. F. amplifier stages to vary the bias and hence the transconductance of the I. F. amplifier tubes in a manner to cause the amplification of the I. F. amplifiers to be greater for weak signals than for those of large amplitude. In AGC systems of this class a resistive-capacitive filtering network is usually employed having a time constant sufficiently large to average out the variations in carrier amplitude corresponding to the modulation but small enough so that the AGC bias voltage varies with the average amplitude of the carrier.

A special problem arises where the AGC system is required to adjust the gain of a receiver for operation in response to pulse type input signals. Since the input pulses usually have an extremely short duration, the conventional AGC network in which the biasing voltage is filtered through a long time-constant resistive-capacitive circuit is not suitable because it cannot provide the required compromise between long time response sufficient to maintain a voltage during the interval between pulses and sufficiently rapid response to become effective during the short duration of the pulses.

Where the AGC system is to operate in conjunction with pulse signal reception equipment capable of tolerating pulse shape distortion, an instantaneous AGC system (IAGC) is often satisfactory. An IAGC system may be defined as a form of AGC system wherein the response time is extremely short, that is, an AGC system of sufficient rapidity to develop a biasing voltage during the duration of a single pulse. Thus the IAGC system is effective only during each pulse duration time, there being no attempt to supply a biasing voltage during the time intervals between pulses. The functional characteristics and typical circuits of IAGC systems are discussed in the M. I. T. Radiation Laboratories Series, volume 23, published by McGraw-Hill Book Co., Inc., 1948, pages 248–252.

Since the IAGC system develops a biasing voltage for each pulse without reference to the amplitude of the previous pulse, an inherent disadvantage of the system is the tendency to cause distortion of the pulses due to the rapid change of biasing voltage during reception of the leading and the trailing edge of each pulse. For example, during the reception of a positive pulse the IAGC system produces a biasing voltage which tends to lower the amplification of the associated receiver as the leading edge of the pulse is received, and tends to raise the amplification of the receiver as the trailing edge of the pulse is received.

An improved AGC system for developing a biasing voltage for pulse type signal reception wherein the pulse signals are subject to comparatively gradual amplitude variation is described in U. S. Patent 2,655,596 entitled "Automatic Gain Control Circuit" by Vernon L. Herren, issued October 13, 1953. In accordance with the Herren AGC system, a biasing voltage is developed during each pulse which is maintained substantially constant during the period between successive pulses. More specifically, the biasing voltage is held substantially constant at a predetermined level in the absence of a pulse. As each pulse is received, the biasing voltage is altered in accordance with the amplitude of the pulse and maintained approximately at the altered level until the next succeeding pulse is received. This is accomplished by developing the biasing voltage from a capacitor used as an energy storage device, the magnitude of the biasing voltage at any instant being proportional to the charge on the capacitor at that instant. The capacitor is charged by the anode circuit of a first vacuum tube which is biased in a manner permitting conduction only when input pulses below a predetermined amplitude are received, and is discharged through the anode circuit of a second vacuum tube biased in a manner permitting conduction only when the input pulses exceed the predetermined amplitude. Thus by the proper selection of circuit values, a smoothly changing output signal from the AGC system may be derived which changes in amplitude proportional to the change in amplitude of successive pulses.

Since, in the Herren AGC system, the biasing voltage need vary only in accordance with the amplitude increments of successive pulses, the system is quite satisfactory for controlling the gain of a receiver subject to pulse input signals having relatively moderate amplitude variations. However, this system is not satisfactory for controlling the amplification of a receiver subject to input pulse signals characterized by sudden changes in signal intensity, such as are encountered when successively or simultaneously receiving signals from two or more co-channel transmitter stations disposed in different locations. Thus, if the amplitudes of two successive pulses are substantially dissimilar, the same difficulties, to a somewhat lesser degree, which are encountered with an IAGC system, result. The rapid change in biasing voltage required to compensate for the large change in pulse amplitude between successive pulses will inevitably result in pulse shape distortion.

In certain applications of radio receiving equipment, it is inevitable that pulse-modulated carrier signals subject to rapid amplitude variations of considerable magnitude will be received, usually resulting from the successive reception of signals from two or more transmitter stations. The difference in signal strength may result from the inequality of transmission power of the various transmitter stations, or from a difference in distance of the stations from the receiving equipment. It then becomes necessary to regulate cyclically the gain of the receiver to compensate for the large difference in signal strength from the various transmitter stations. This problem is especially encountered in "Hyperbolic Navigation Systems."

Hyperbolic navigation is a method of ascertaining the geographical location of a vessel or aircraft by determining the time required to receive, by the vessel, radio signals transmitted from two or more co-channel transmitter stations variously located at different distances from the vessel. Each of the stations transmits alternately, each transmission consisting of a group of code or station identification pulses followed by a single timing pulse.

In typical navigation systems of this class, combinations of "master" and "slave" transmitter stations are utilized. The master station is the main transmitter, a master station transmission causing an associated slave station, separated geographically from the master station, to be triggered a fixed period later. For example, in a three-station system, one master and two slave stations, conveniently referred to as slave 1 and slave 2, are utilized. The master station alternately produces two different identifiable transmissions herein referred to as a primary and a secondary master transmission. Each of the two slave stations transponds alternately a fixed time interval after each transmission of the master station in response to the identification pulses of the master station. For example, after each primary master transmission, slave 1 transmits, and after each secondary master transmission, slave 2 transmits. Thus during the reception of each transmission, by reference to its position in the transmission cycle, the succeeding transmission may be anticipated.

Consequently, the timing pulses from each station are time-space referenced at their origin. A navigator, desiring to ascertain his geographical position, employs receiving equipment especially adapted for simultaneous or sequential reception of the signals transmitted by the variously located transmitter stations. Furthermore, the receiving equipment is capable of identifying and measuring the time interval between the timing pulses of the master and slave transmitters. In addition to the receiver proper, therefore, auxiliary equipment is utilized to identify the transmitter stations and measure the time intervals between the timing pulses. The auxiliary equipment used to identify the particular transmitter station which is transmitting is usually referred to as a "decoder," and the equipment used for measuring the timing pulse intervals is referred to as a "time measurement indicator."

By comparing the time interval between the received timing pulses with the previously known time intervals of the timing pulses at their origin, the location of the vessel carrying the receiving equipment may be ascertained by triangulation. Complete hyperbolic navigation systems of this class are described in detail in the MIT Radiation Laboratory Series, volume 2, pages 56–85, and volume 20, pages 261–274. Decoders are fully described in the MIT Radiation Laboratory Series, volume 3, pages 180–204, and valume 20, pages 426–429 and pages 454–458. Time measurement indicators are described and illustrated in the MIT Radiation Laboratory Series, volume 20, pages 261–274, inclusive.

Because of the accurate pulse time measurements required, constant amplitude output pulses relatively free from distortion must be developed by the receiver of the hyperbolic navigation system. Since the receiver is subject to the alternate transmission of the variously located master and slave transmitter stations, cyclic pulse amplitude variations of considerable magnitude are inevitable. In typical applications of hyperbolic navigation systems, it is not uncommon to receive signals in sequence varying as much as 50 db in signal intensity. On the other hand, the auxiliary equipment, forming a necessary part of the receiving system, requires timing pulses from the output of the receiver of substantially constant amplitude level; usually a time measurement indicator cannot tolerate amplitude variation greater than 3 db. This places rigid requirements on a receiver gain control system which are not met satisfactorily by the conventional AGC, the IAGC, nor the Herren AGC systems.

A quasi-automatic gain control system known as a "differential-gain-balance" circuit adapted for operation in hyperbolic navigation systems has been developed using a square wave biasing voltage for each pair of co-channel transmitters in the system. The square wave is developed from the output of a bistable flip-flop which is triggered by pulses from the decoder in a manner whereby the square wave is at a minimum amplitude during the time that pulse signals are received from the transmitter station furthest removed from the receiver, and is at a maximum amplitude while pulses are received from the nearest transmitter. The amplitude of the square wave is controlled manually to permit optimum constant amplitude signal reception from both transmitter stations, the amount of reduction of gain corresponding to amplitude and polarity, respectively, of the square wave as determined by the manual setting. Thus, by manually adjusting the amplitude of the square wave during an early transmission of one of the co-channel transmitters, the signal strength received during the succeeding transmission of the same station is anticipated. Differential gain balance circuits are fully described in the MIT Radiation Laboratory Series, volume 4, pages 390–395.

The differential gain balance circuit, although having the advantage of being able to compensate the amplification of the receiver for differences of input signal strength variation resulting from the geographical distance of the various transmitter stations, has the distinct disadvantage of requiring manual amplitude control of the square wave biasing voltage. Where the receiving system is located in a relatively slow moving vessel, the biasing voltage need only be regulated at infrequent intervals for changes in signal strength resulting from the motion of the vessel. However, in a more rapidly moving vessel such as an airplane, frequent amplitude regulation of the biasing voltage is required to compensate for the rapid change in relative distance of the receiver from the transmitter stations. The problem becomes particularly acute when the receiving system is located in a high speed vessel, such as an airplane, wherein the geographical distance between the plane and the ground transmitter stations is constantly undergoing rapid change. Under such conditions a manual volume control, such as the differential gain circuit, is not practical. In addition, the above gain control system makes no allowance for minor changes in signal strength during the transmission period of each transmitted station resulting from variations in atmospheric conditions and unavoidable drift in receiver amplification.

It is therefore an object of the present invention to provide a sequential automatic gain control system for maintaining substantially constant the amplitude of output signals from a radio receiving system subject to varying amplitude input signals from two or more co-channel transmitter stations.

Another object of the present invention is to provide an SAGC system of the class referred to wherein the radio receiving system is subject to pulse type input signals.

Yet another object of the present invention is to provide an SAGC system of the class referred to that is completely automatic in operation.

A further object of the present invention is to provide an SAGC system of the class referred to which causes substantially no signal distortion by its operation.

A still further object of the present invention is to provide an SAGC system of the class referred to capable of maintaining the output signal amplitude variation within less than 3 db with an input signal amplitude variation of as much as 50 db.

Still another object of the present invention is to provide an SAGC system of the class referred to suitable for operation with the receiver of a hyperbolic navigation system.

In accordance with the basic concepts of the present invention, a single, continuously variable, biasing voltage is produced for controlling the amplification of a radio receiving system subject to input signals from N sequentially operating transmitter stations by sequentially developing, during the transmission cycles of the various transmitter stations, N corresponding constituent voltages which are serially combined to form the single biasing voltage. Each constituent voltage is developed in response to signals received from a corresponding one of the transmitter stations, and is developed as a series of cyclically recurring voltage signals corresponding to the transmission periods of the station. More specifically, during each transmission period of one of the transmitter stations, a corresponding cyclic voltage signal is developed covering the entire transmission period and having an amplitude proportional at all times to the amplitude of the signals received from the transmitter station.

Each cyclic voltage signal is produced with an initial value substantially equal to the final value of the immediately preceding cyclic voltage signal of the same constituent voltage. This is accomplished by developing each of the N constituent voltages across a separate energy storage device such as a capacitor thereby substantially preserving the final value of each cyclic voltage signal of a constituent voltage for utilization as an initial value for the next succeeding cyclic voltage signal of the same constituent voltage. Thus, by forming the biasing voltage from the cyclic voltage signals of the constituent voltages, the biasing voltage will have an anticipatory level at the beginning of each transmission period of a transmitter substantially equal to the amplitude of the biasing voltage required for compensating the receiver amplification during the immediately preceding transmission period of the transmitter. As a result, once a constituent voltage is established for each transmitter station, the constituent voltages will require only slight variation in amplitude during succeeding transmission periods of the corresponding transmitter stations to compensate for changes in input signal strength resulting from variations in geographical distance between transmitter and receiver, changes in atmospheric conditions or variations in the signal amplitude of a transmitter.

In its basic structural form, an SAGC system in accordance with the present invention comprises a sequence control circuit responsive to output signals from the receiving system for producing N pairs of binary or two-level sequence control signals, each pair including ingress or input and egress or output gate control signals, and a biasing voltage circuit responsive to output signals from the receiving system and the sequence control signals from the sequence control circuit for producing the continuous biasing voltage which is returned to the receiving system for controlling its amplification. Included within the biasing voltage circuit are N similar voltage channels, each being responsive to the output signals from the receiver and an associated one of the N pairs of sequence control signals from the sequence control circuit for producing a corresponding one of the N constituent voltages. The biasing voltage circuit may further include an input circuit, such as a coupling capacitor, for coupling the output signals from the receiving system to each of the N voltage channels, and an output circuit, such as a cathode follower, for receiving the constituent voltage signals produced by the N voltage channels and for producing the continuous biasing voltage.

Each of the N voltage channels includes an input gate, an energy storage circuit, and an output gate. The input gate, in response to the input gate control signals of the associated pair of sequence control signals, gates energy contained in the output signals from the receiving system into the energy storage circuit, and the potential developed across the energy storage circuit resulting from the energy introduced therein, is gated by the output gate to the output circuit in response to the output gate control signals of the pair of sequence control signals, thus developing the voltage signals of the corresponding constituent voltage.

An SAGC system according to the present invention may be used in combination with the receiving system of a hyperbolic navigation system wherein the receiving system is responsive to pulse-modulated carrier input signals from a master and one or more slave co-channel transmitter stations variously located at different geographical distances from the receiving system. Typically, the receiving system includes a radio receiver and auxiliary equipment comprising, among other things, a decoder. The radio receiver is utilized for amplifying and detecting the input signals and producing demodulated pulse output signals; and the decoder is utilized to receive the demodulated pulse signals from the receiver and produce identification pulses during the transmission period of each transmitter station identifying the station producing the transmission. For example, in a three-station system wherein the master station alternately transmits a primary and a secondary master transmission, and slaves No. 1 and No. 2 alternately transpond after each master station transmission, the decoder has four individual output circuits, corresponding, respectively, to a primary master, a secondary master, a slave No. 1 and a slave No. 2 transmission. During each transmission period of a transmitter station, the decoder, in response to code pulses, included in each transmission, produces an identification pulse on the corresponding output circuit identifying the transmission.

Where the SAGC system of the present invention is used in conjunction with the receiving system of a hyperbolic navigation system, the sequence control circuit is adapted to receive the identification pulses developed by the decoder for producing the sequence control signals; and the biasing voltage circuit is adapted to receive the sequence control signals developed by the sequence control circuit and the demodulated and amplified pulses developed by the receiver for producing the continuous biasing voltage which is fed back to the receiver to control its amplification. It should be understood, however, that the SAGC system of the present invention is equally operable in conjunction with any receiving system subject to input signals from sequentially operating co-channel transmitter stations. The output signals of the decoder are merely utilized for convenience in identifying the transmitter stations. Where the co-channel transmitter stations operate in a sequential or cyclic manner, the identity of each transmission received by the receiving system is readily ascertainable by reference to the identity of the preceding transmission. Thus the sequence control circuit may be modified to respond sequentially in a cyclic manner to each transmission rather than responding to the identification pulses of the decoder.

The novel features which are believed to be characteristic of the invention, both as to its organization and method of operation, together with further objects and advantages thereof, will be better understood from the following description considered in connection with the accompanying drawings, in which several embodiments of the invention are illustrated by way of example. It is to be expressly understood, however, that the drawings are for the purpose of illustration and description only, and are not intended as a definition of the limits of the invention.

Figure 1:
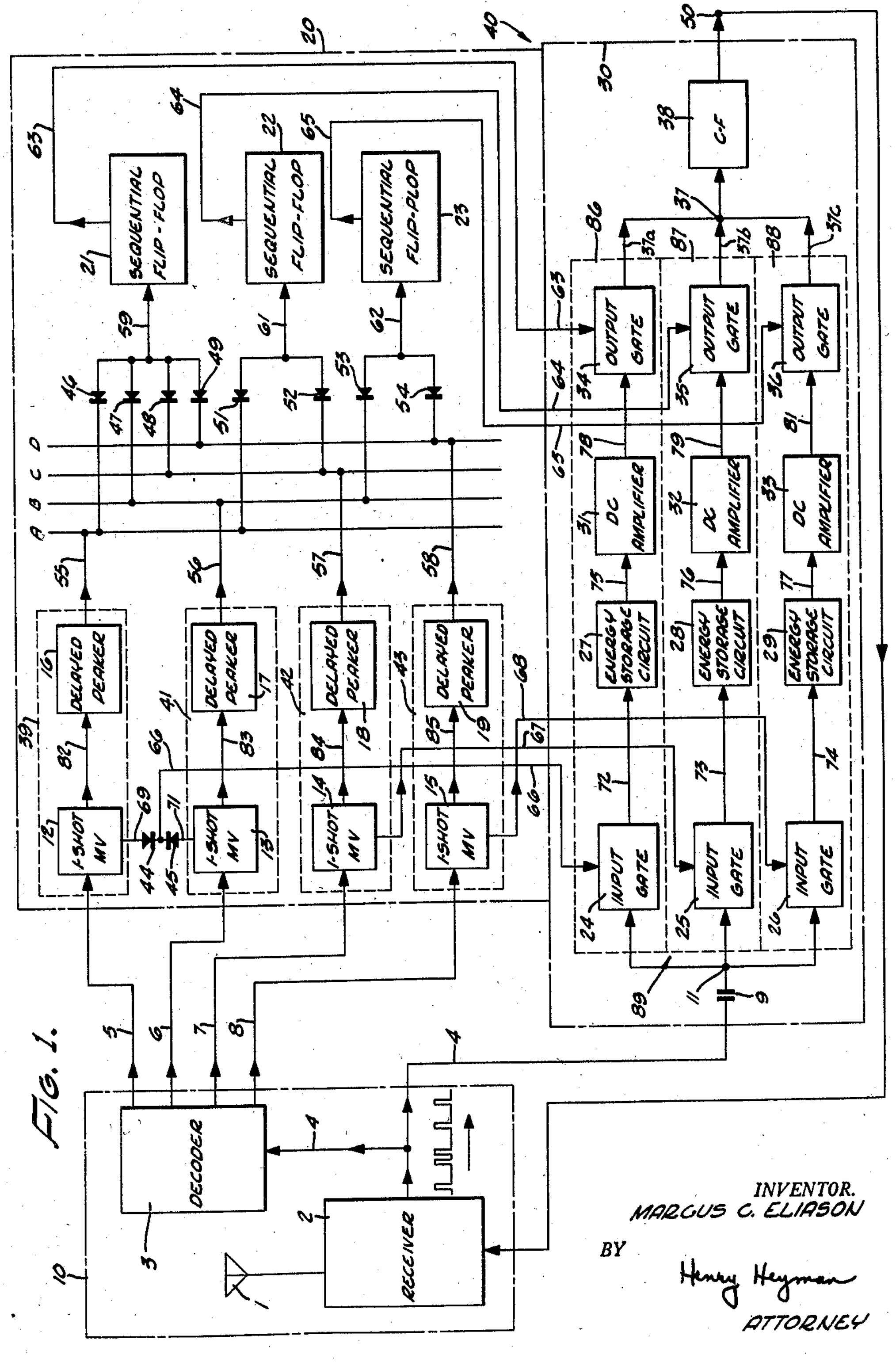
Fig 1 is a schematic diagram, in block form, of an embodiment of the SAGC system of the present invention illustrated in combination with a receiver for a hyperbolic navigation system.

Reference is now made to Fig. 1 wherein there is presented in schematic block form an SAGC system 40, indicated by broken lines, illustrated in combination with a radio receiving system 10 also indicated by broken lines, the combination forming an amplification stabilized receiving system adapted to receive pulse-modulated carrier wave input signals of fluctuating amplitude from three co-channel, variously located, transmitter stations, and produce amplified and demodulated output signals of substantially constant amplitude on output lead 4 of the receiving system 10. To accomplish this, a single, continuously variable, biasing voltage is produced by the SAGC system 40 at terminal 50 which is applied to the receiving system 10 for controlling its amplification.

For purposes of illustrating the present invention, the receiving system 10 is represented in Fig. 1 as the receiving system of a three-station hyperbolic navigation system for receiving pulse-type carrier input signals from a master, a No. 1 slave, and a No. 2 slave transmitter station. The receiving system 10 includes antenna 1 for intercepting the pulse type input signals from the transmitters, a receiver 2 coupled to antenna 1 and responsive to the input signals for detecting and amplifying the input signals to produce the demodulated, pulse output signals on output lead 4, and a decoder 3 coupled to the receiver 2 and responsive to the pulse output signals appearing on lead 4 for producing identification pulses on leads 5, 6, 7, and 8 from decoder 3. As previously mentioned, in a hyperbolic navigation system each group of pulse output signals developed by the receiving system represent a single transmission of one of the transmitter stations and consists of code pulses followed by a single timing pulse. The decoder 3 responds to the code pulses of each transmission and produces a single identification or triggering pulse on output leads 5, 6, 7, and 8, immediately following the code pulses of a primary master, a secondary master, a slave No. 1, and a slave No. 2 transmission, respectively.

Figure 2:
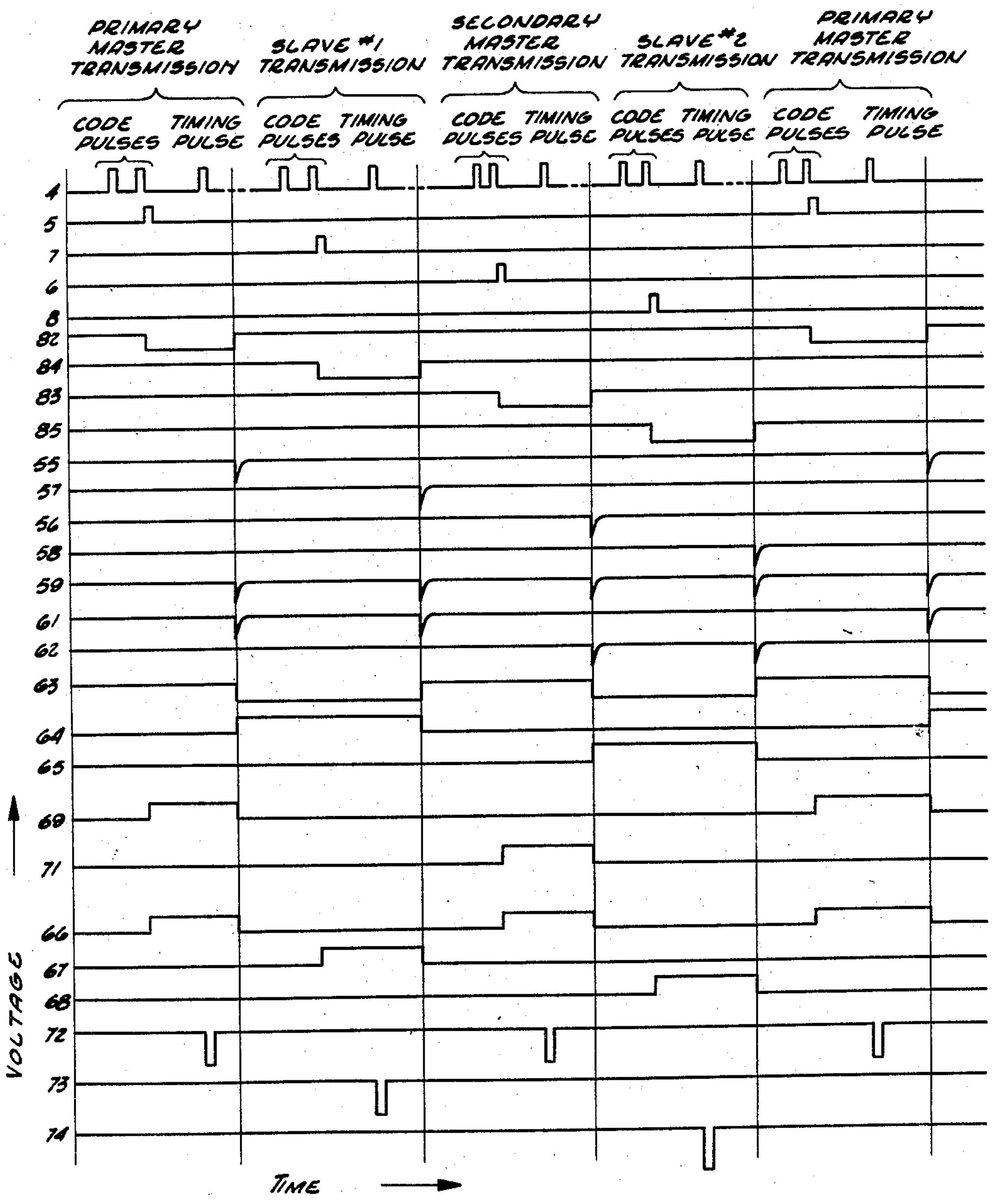
Fig. 2 is a chart of voltage wave forms associated with specific portions of the SAGC system illustrated in Fig. 1.

Referring momentarily to Fig. 2, there is presented a voltage wave chart illustrating the voltage wave shapes at various points of the amplification-stabilized receiving system illustrated in Fig. 1, wherein the relative voltage amplitude of each signal is plotted vertically and time is plotted horizontally. Thus if a vertical line is drawn down the length of the chart from any point at the top, the intersection of the line with the voltage signal representations will indicate the relative amplitude of each voltage signal at that instant. Each voltage signal illustrated is identified by a number at the extreme left origin of the signal which directly corresponds to the reference numeral utilized in Fig. 1 to identify the lead associated with the voltage signal. For example, the pulse output signals produced on lead 4 by receiver 2 of Fig. 1 are illustrated on line 4 of the voltage chart of Fig. 2 wherein pulse groups representing a primary master, a slave No. 1, a secondary master, a slave No. 2, and a second primary master transmission are represented sequentially. Each transmission is illustrated as consisting of two code pulses, so labeled, followed by a single timing pulse. The identification or triggering pulses developed by the decoder 3 on leads 5, 6, 7, and 8 of Fig. 1 are illustrated on lines 5, 6, 7, and 8, respectively, of the voltage chart of Fig. 2. Thus, on line 5 a single pulse is illustrated which is produced immediately following the code pulses of a primary master transmission. Similarly, single pulses are illustrated on lines 7, 6, and 8 immediately following the trailing edge of the last code pulse of the slave No. 1, the secondary master, and the slave No. 2 transmission, respectively.

It should be noted that although both the output pulses and identification pulses are represented as positive pulses, the SAGC system of the present invention is equally operable in response to negative pulses or a combination of positive and negative pulses. It is assumed for purposes of illustrating the present invention that the biasing voltage developed at terminal 50 of Fig. 1 is a negative voltage and supplied to the amplification stages of the receiver 2 in a manner whereby an increase in amplitude of the biasing voltage, i. e., a change in amplitude from a less negative to a more negative value, is accompanied by a corresponding decrease in amplification of the amplifier stages. It is merely a question of reversing the polarity or transposing the connection of the biasing voltage to the amplification stages of the receiver to obtain the opposite effect in a receiving system producing negative output pulse signals.

In order to facilitate a clear explanation of the operation of the SAGC system of Fig. 1, repeated reference will be made to the voltage chart of Fig. 2 in the ensuing discussion.

Returning to Fig. 1, the SAGC system 40 includes a sequence control circuit 20 responsive to the identification pulses developed by the decoder 3 on leads 5, 6, 7, and 8, for producing a first, a second, and a third pair of two-level sequence control signals on output leads 63, 66; 64, 67; and 65, 68; respectively, and a biasing voltage circuit 30 coupled to the sequence control circuit 20 and responsive to the sequence control signals and the output signals developed by receiver 2 on lead 4 for producing the continuously variable biasing voltage at terminal 50.

The sequence control circuit 20 produces each pair of sequence control signals in time correspondence with the transmission periods of a corresponding one of the transmitter stations, the first pair of sequence control signals corresponding to the transmission periods of the master transmitter station, and the second and third pair of sequence control signals corresponding to the transmission periods of slave No. 1 and slave No. 2 transmitter stations, respectively. In addition, each pair of sequence control signals consists of two types of control signals herein referred to as ingress or input gate control signals and egress or output gate control signals, respectively. Both the ingress and egress signals are characterized by having but one of two levels at any instant, a relatively high and a relatively low voltage level, hereinafter referred to arbitrarily and for convenience as 1 and 0 levels, respectively. Ingress signals are produced on leads 66, 67, and 68, and egress signals on leads 63, 64, and 65 by the sequence control circuit 20.

Both the ingress and egress signals of each pair of sequence control signals are developed as 1-level signals during a portion of the transmission periods of the corresponding transmitter station, and as 0-level signals at all other times. The principal difference between the two types of signals is in the timing and the duration of their 1-level values. More specifically, the ingress signals of each pair of sequence control signals are produced as 1-level signals only during the terminal portion, including the timing pulses but excluding the code pulses, of each transmission period of the corresponding transmitter station, whereas the egress signals of each pair are developed as 1-level signals during the entire transmission periods of the corresponding transmitter station.

The time relationship between the1-level values of the ingress and egress signals of each pair of sequence control signals may be more clearly visualized by reference to Fig. 2 wherein the ingress signals are represented on lines 66, 67, and 68 and the egress signals on lines 63, 64, and 65. It will be noted that the first pair of sequence control signals, illustrated on lines 63 and 66, are represented as 0-level signals at all times except during the transmission periods of the master transmitter station. Similarly, the second and the third pair of sequence control signals, illustrated on lines 64, 67; and 65, 68; respectively, are represented as 0-level signals at all times except during the transmission periods of the slave No. 1 and the slave No. 2 transmitter stations, respectively. It will be noted further that the ingress signals of each pair of sequence control signals are 1-level signals for a period commencing immediately after the code pulses and extending to the end of the transmission period of the corresponding transmitter station, whereas the egress signals are 1-level signals during the entire corresponding transmission period. For example, the ingress signals of the first pair of sequence control signals, illustrated on line 66, are 1-level signals during each primary and secondary transmission period for the interval of time between the leading edge of the corresponding identification pulses, appearing on lines 5 and 6, and the end of the corresponding transmission period. The egress signals of the same pair of sequence control signals, appearing on line 63, however, have a 1-level value from the beginning to the end of each primary master and secondary master transmission.

Returning to Fig. 1, with particular reference to the biasing voltage circuit 30, the output signals produced by receiver 2 on lead 4 are coupled by a coupling capacitor 9 to a voltage channel circuit referred to generally as the voltage channel circuit 89. In response to the receiver output signals carried by lead 4 and the sequence control signals developed on leads 63 to 68, the voltage channel circuit 89 repetitively produces, in sequential order, a first, a second, and a third constituent voltage on leads **37*a*, 37*b*, and 37*c*, respectively, which are impressed on a common terminal or junction point 37**.

As previously mentioned, each constituent voltage is comprised of a series of cyclic voltage signals. The cyclic voltage signals of each of the constituent voltages are produced during the transmission periods of a corresponding one of the transmitter stations; i. e., a cyclic voltage signal of the first, the second, and the third constituent voltage is produced during each transmission period of the master, the No. 1 slave, and the No. 2 slave transmitter stations, respectively. The constituent voltages appearing at point 37 are directly applied to a cathode follower 38. The output signals of the cathode follower are directly applied to the output terminal 50 and represent the continuously variable biasing voltage produced by the SAGC system 40 of the present invention.

The voltage channel circuit 89 is comprised of a first, a second, and a third substantially identical voltage channel 86, 87, and 88, respectively. Each of the voltage channels 86, 87, and 88 is responsive to the receiver output signals appearing at junction point 11 and an associated one of the pairs of sequence control signals from the sequence circuit 20 for producing a cyclic voltage signal of a corresponding one of the constituent voltages during each transmission period of the corresponding transmitter station. For example, the first voltage channel 86 produces a cyclic voltage signal of the first constituent voltage during each primary and secondary transmission period of the master transmitter station in response to the receiver output signals appearing at input junction point 11 and the first pair of sequence control signals appearing on leads 63 and 66. Similarly, the second and third channels 87 and 88 respond to the output signals at point 11 and the second and third pair of sequence control signals appearing on leads 67, 64; and 68, 65; respectively, for producing correspondingly a cyclic voltage signal of the second and third constituent voltages during each transmission period of the slave No. 1 and the slave No. 2 transmitter station, respectively.

Since a cyclic voltage signal is produced for each transmission period of the transmitter stations, the sequentially combined cyclic voltage signals from all three of the voltage channels 86, 87, and 88 results in a continuous voltage being developed at point 37. The biasing voltage appearing at the output terminal 50 is substantially similar to the voltage developed at point 37. The action of the cathode follower 38 is merely to reproduce, at a lower impedance level, the voltage signals appearing at point 37.

During each primary and secondary transmission period of the master transmitter station, voltage channel 86 produces a cyclic voltage signal of the first constituent voltage having an initial value equal to the final value of the immediately preceding cyclic voltage signal of the first constituent voltage, and having an amplitude, at all other times during the transmission period proportional to the amplitude of the output signals produced on lead 4 by the receiver 2. Similarly, during each transmission period of the slave No. 1 transmitter station, voltage channel 87 produces a cyclic voltage signal of the second constituent voltage having an initial value equal to the final value of the preceding cyclic voltage signal of the second constituent voltage; and voltage channel 88 produces a cyclic voltage signal of the third constituent voltage during each transmission period of the slave No. 2 transmitter station having an initial value equal to the final value of the preceding cyclic voltage signal of the third constituent voltage. In addition, the cyclic voltage signals of the second and third constituent voltages have an amplitude at any instant during the transmission periods of the corresponding transmitter stations proportional to the amplitude of the output signals from the receiver 2 appearing on terminal 4 at that instant.

This is accomplished by providing each of the voltage channels 86, 87, and 88, included in the channel circuit 89, with an input gate 24, 25, 26, an energy storage circuit 27, 28, 29, a D. C. amplifier 31, 32, 33, and an output gate 34, 35, 36, respectively. The input gate 24, 25, or 26 of each voltage channel is responsive to the ingress signals of the associated pair of sequence control signals for selectively gating the output signals appearing at junction point 11 into the energy storage circuit 27, 28 or 29, of the voltage channel.

Each of the input gates 24, 25, and 26, in addition to selectively gating the output signals or pulses appearing at junction point 11 to the associated voltage channel, inverts the signals so gated. This characteristic of the input gates will be explained in more detail later on.

The voltage appearing across each of the energy storage circuit 27, 28 or 29 resulting from the energy introduced therein, is amplified by the associated D. C. amplifier 31, 32 or 33 and impressed on the respective output gate 34, 35 or 36 of the voltage channel. The output gate, in response to the egress signals of the associated pair of sequence control signals, gates the voltage impressed thereon from the D. C. amplifier to the output terminal **37*a*, 37*b* or 37*c* of the channel and thus to the common output junction point 37** forming the corresponding constituent voltage of the continuous biasing voltage. The input and output gates are each responsive to one-level voltage signals for developing at its output the voltage signals appearing at its input.

Thus channel 86 includes input gate 24, energy storage circuit 27, D. C. amplifier 31, and output gate 34. The input gate 24, in response to 1-level ingress signals appearing on lead 66, gates the voltage signals from input junction 11, to output lead 72, the input gate 24 blocking the signals while the ingress signals on lead 66 are 0-level signals. Storage circuit 27 includes an energy storage device, such as a capacitor, for storing energy contained in the signals appearing on lead 72 and for producing an output voltage on output lead 75 having an amplitude proportional at any instant to the energy stored in the storage circuit 27 at that instant. The D. C. amplifier 31 is a conventional direct-coupled amplifier for amplifying the voltage signals on lead 75 and for producing an amplified version thereof on output lead 78 which is fed to the input circuit of the output gate 34. The output gate 34, in response to 1-level egress signals appearing on lead 63, gates the voltage signals appearing on lead 78 to the output lead **37*a***.

Voltage channels 87 and 88 are similarly constructed and functionally operable in the same manner as voltage channel 86; therefore, further explanation of channels 87 and 88 is considered unnecessary.

Referring momentarily to the voltage chart of Fig. 2, keeping in mind the input and output lead reference numerals of Fig. 1, the sequential operation of each of the voltage channels 86, 87, and 88 of Fig. 1 may be more clearly understood with reference to the time relationships of the ingress and egress signals applied to each of the voltage channels. Since the first pair of sequence control signals, represented on lines 63 and 66, respectively, of the voltage chart of Fig. 2, have 1-level values during each transmission period of the master transmitter station, both the input gate 24 and the output gate 34 of the first voltage channel 86 of Fig. 1 are opened during each master transmission period. The ingress signals on line 66, however, are 1-level signals only during the period commencing immediately after the code pulses and terminating at the end of the transmission period of each master transmission. Thus only the timing pulses received from the master transmitter station are inverted and passed to lead 72 by input gate 24 of Fig. 1. This is illustrated on line 72 of the voltage chart wherein the timing pulses of the master transimssions are represented as negative or inverted and amplified pulses.

In a similar manner, input gate 25 selectively gates and inverts the timing pulses received from to No. 1 slave transmiter to lead 73, and input gate 26 develops a negative version of the timing pulses produced by the slave No. 2 transmitter on its output lead 74 as illustrated by a negative pulse on line 73 and line 74, respectively, of the voltage chart of Fig. 2. The voltage developed by each of the energy storage circuits 27, 28 and 29 is therefore proportional to the amplitude of the corresponding timing pulses gated therein. These voltages are amplified by the associated D. C. amplifiers. Accordingly, the amplitude of the voltage impressed on each of the output gates 34, 35, and 36 of Fig. 1 is proportional to the amplitude of the timing pulses gated into the corresponding voltage channel and appearing on leads 72, 73, and 74, respectively, which are illustrated in Fig. 2.

As illustrated on lines 63, 64, and 65 of Fig. 2, the egress signals appearing on leads 63, 64, and 65 of Fig. 1 are 1-level signals during the entire transmission periods of the master, the No. 1 slave, and the No. 2 slave transmitter stations, respectively. Therefore, during each primary and secondary transmission period of the master transmitter, the voltage impressed by lead 78 on output gate 34 is gated to the output lead **37*a* of voltage channel 86. Similarly, the voltage appearing on lead 79 is gated by output gate 35 to the output lead 37*b* of voltage channel 87 during each transmission period of the No. 1 slave transmitter station. Finally, output gate 36 passes the voltage produced on terminal 81 to the output lead 37*c* of the voltage channel 88** during each transmission period of the sleeve No. 2 transmitter station.

The sequence control circuit 20 of Fig. 1 includes a first, a second, a third, and a fourth ingress-delay signal circuit 39, 41, 42, and 43, respectively, each indicated by broken lines. The first ingree-delay signal circuit 39 is responsive to the identification signals produced by decoder 3 and available from lead 5 for producing ingress or input control signals on lead 69 and first delay or triggering pulses on lead 55. Ingress control signals are developed on lead 71 and second delay or triggering pulses on lead 56 by the second ingress-delay signal circuit 41 in response to the identification signals developed on lead 6. The third ingress-delay signal circuit 42 produces ingress control signals on lead 67 and third delay or triggering signals on lead 57 in response to the identification signals developed on lead 7. Similarly, the fourth ingress-delay signal circuit 43 produces ingress control signals on lead 68 and fourth delay or triggering signals on lead 58 in response to identification signals received on lead 8.

The ingress-delay signal circuits 39, 41, 42, and 43 of the sequence control circuit 20 are substantially identical in that each includes a 1-shot or monostable multivibrator and a delayed peaker. Thus the first ingress-delay signal circuit 39 includes a 1-shot multivibrator identified as 1-shot MV 12 and delayed peaker 16, the second ingress-delay circuit 41 includes 1-shot MV 13 and delayed peaker 17, the third ingress-delay circuit includes 1-shot MV 14 and delayed peaker 18, and the fourth ingress-delay circuit includes 1-shot MV 15 and delayed peaker 19.

Each of the 1-shot MV's 12, 13, 14, and 15 are typical 1-shot or monostable circuits well-known in the art characterized by having two states of operation, a stable state and an unstable state. A 1-shot MV is triggered from its stable state to its unstable state by a triggering pulse, and remains in the unstable state for a predeterminable period of time, at the end of which time it returns again to its stable state. The type of triggering pulse and the length of the period of the 1-shot MV is determined by the nature of the input circuit and the values of the components selected.

A 1-shot MV of this general class is further characterized by producing simultaneously a pair of complementary, two-level or binary output voltage indicating the state of the 1-shot MV. The pair of output voltages are complementary binary signals in that when one is a relatively high or 1-level signal, the other is a relatively low or 0-level signal. For convenience in future discussion, the output voltage of a 1-shot MV which is a relatively low or 0-level voltage during the stable state and a relatively high or 1-level voltage during the unstable state of the multivibrator will hereinafter be referred to as the first output. The other complementary output will be referred to as the second output. The signals developed by a 1-shot MV on the first and the second output will be referred to as the first and the second output signals, respectively. Thus the ingress or input control signals appearing on leads 69, 71, 67, and 68 correspond to the first output signals of 1-shot MV's 12, 13, 14, and 15, respectively, whereas the signals appearing on leads 82, 83, 84, and 85 correspond to the second output signals of the respective 1-shot MV's.

The 1-shot MV's 12, 13, 14 and 15 are each designed to be triggered from the stable to the unstable state in response to the positive identification pulses developed by the decoder 3 on leads 5, 6, 7, and 8, respectively. In addition, as will be more fully explained later on, 1-shot MV's 12, 13, 14 and 15 are each designed to have an unstable state period equal to the time interval between the trailing edge of the last code pulse, corresponding to the leading edge of the associated identification pulse, and the end of the corresponding transmission period.

The delayed peakers 16, 17, 18, and 19 are substantially identical and respond to the second output signals of an associated 1-shot MV for producing the corresponding negative delay pulses. For example, the second output signals appearing on lead 82 of the 1-shot MV 12 of the ingress-delay signal circuit 39 are impressed on the input circuit of delayed peaker 16, which in response thereto, produces the first delayed negative pulses on lead 55. Delayed peaker 17 of the ingress-delay signal circuit 41 is responsive to the second output signals of 1-shot MV 13 appearing on lead 83 and produces the second delayed negative pulses on lead 56. Similarly, delayed peakers 18 and 19 are responsive to the second output signals of 1-shot MV's 14 and 15, respectively, appearing on leads 84 and 85 for producing the second and third delayed negative pulses, respectively, appearing on leads 57 and 58.

The above voltage signal relationships are illustrated by the corresponding voltage forms of Fig. 2 wherein the identification pulses appearing on leads 5, 7, 6, and 8 developed by the decoder 3 are illustrated on corresponding lines; the second output signals of 1-shot MV's 12, 13, 14, and 15 are illustrated on lines 82, 84, 83, and 85, respectively; and the negative pulse outputs of delayed peakers 16, 17, 18, and 19 are illustrated on lines 55, 57, 56, and 58, respectively. It will be noted that the second output signals of 1-shot MV 12, appearing on line 82, have a 1-level at all times except during the period of each primary master transmission from the leading edge of the identification pulses on line 5 to the end of the transmission period. The 0-level voltage period of the signals on line 82 represent the periods of the unstable state of 1-shot MV 12 after being triggered by the identification pulses on line 5. It will be noted that the second output signals of 1-shot MV 13, illustrated on line 83, have a 0-level value following the leading edge of the identification pulse illustrated on line 6 until the end of the secondary master transmission period. Similarly, the second output signals of 1-shot MV's 14 and 15, illustrated on lines 84 and 85, respectively, are changed from their 1 to 0-level values coincident with the leading edge of the identification pulses appearing on lines 7 and 8, respectively, and are maintained at the 0-representing level until the end of the slave No. 1 and slave No. 2 transmission periods, respectively.

From the voltage chart of Fig. 2, it will be further noted that the first negative delay pulses on line 55 are developed coincident in time with the trailing edge or rise from the 0 to the 1-representing level of the second output signals of 1-shot MV 12 illustrated on line 82. The second delay pulses, illustrated on line 56, are produced by delay peaker 17 in response to the trailing edge or rise from the 0 to the 1-level voltage of the second output signals of 1-shot MV 13 illustrated on line 83. Similarly, it may be seen that the negative signals on lines 57 and 58 are developed at the instant the second output signals on lines 84 and 85, respectively, change from their respective 0 to their respective 1-level values.

By a comparison of the second output signals illustrated on lines 82, 83, 84, and 85 of the 1-shot MV's 12, 13, 14, and 15, respectively, with the first output signals of the 1-shot MV's illustrated on lines 69, 71, 67, and 68, respectively, it is noted that they are complementary signals, the second output signals being at all times at the opposite level compared to that of their corresponding first output signals. For example, when the second output signals illustrated on line 82 are 1-level signals, the corresponding first output signals on line 69 are 0-level signals, and vice versa. Similarly, the signals on line 71 are complementary to those on line 83, the signals on line 67 are complementary to those on line 84, and the signals on lines 68 and 85 have opposite levels at all times. Thus the first, third, second, and fourth delay pulses illustrated on lines 55, 57, 56, and 58, respectively, occur coincident in time with the fall or trailing edge of the ingress signals appearing on lines 69, 67, 71, and 68, respectively, where the ingress signals appearing on lines 69, 67, 71, and 68 corresponding to the first output signals of 1-shot MV's 12, 14, 13, and 15, respectively, of Fig. 1.

Inasmuch as each of the ingress-delay signal circuits 39, 41, 42, and 43 of the sequence control circuit 20 of Fig. 1 are substantially identical, a detailed explanation of the structure of one of the ingress-delay signal circuits, such as ingress-delay circuit 39, will be sufficient. Thus reference is now made to Fig. 5 presenting a schematic circuit diagram of the ingress-delay signal circuit 39 indicated by broken lines.

Figure 5:
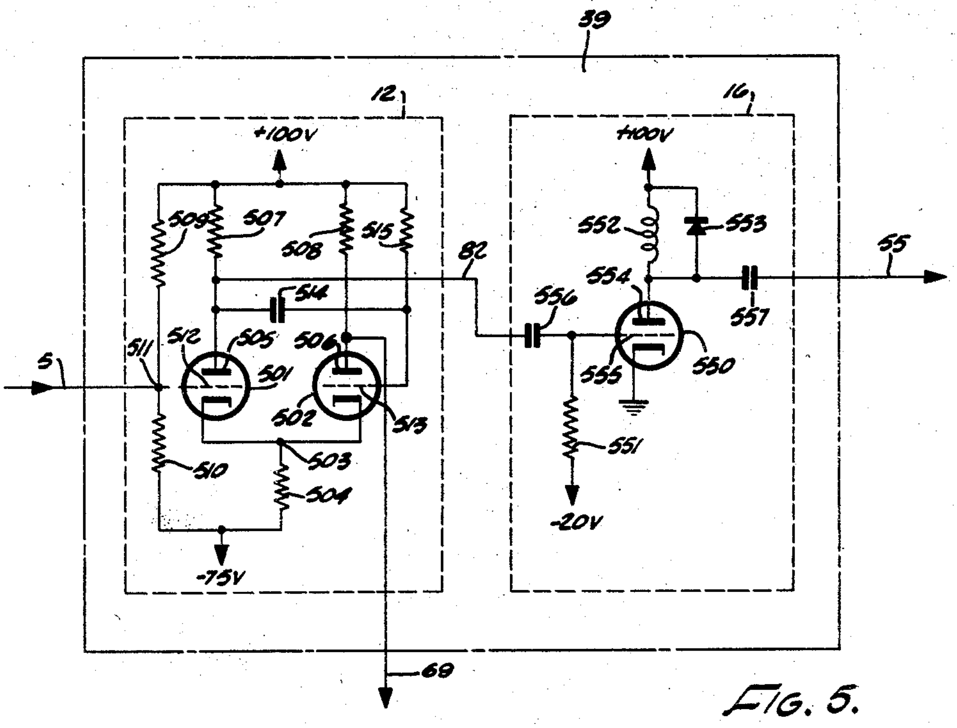
Fig. 5 is a schematic circuit diagram of an embodiment of one of the ingress-delay signal circuits of the sequence control circuit illustrated in Fig. 1.

As indicated in the Fig. 5, ingress-delay signal circuit 39 includes the 1-shot MV 12 and the delayed peaker circuit 16, each indicated by dotted lines. The 1-shot MV 12 is responsive to the identification signals on lead 5 for producing first output signals on lead 69 and for producing complementary, second output signals on lead 82. The delayed peaker 16 is coupled to the 1-shot MV 12 by lead 82 and is responsive to the first output signals on lead 82 for producing delayed or negative pulses on output lead 55.

The stable state of the 1-shot MV 12 is characterized by conduction of a triode 502 and non-conduction of a triode 501, its unstable state being characterized by conduction of triode 501 and non-conduction of triode 502.

The cathodes of triodes 501 and 502 are connected to a common junction point 503 which in turn is connected through a resistor 504 to a −75 v. source. The anodes 505 and 506 of triodes 501 and 502 are connected to a +100 v. source through plate load resistors 507 and 508, respectively. A voltage divider circuit comprised of a resistor 509 and 510 in series is connected between the +100 v. and the −75 v. sources. The common junction point 511 of resistors 509, 510 is tied to the control grid 512 of triode 501 and is also connected to lead 5 which carries the positive indentification pulses. Control grid 513 of triode 502 is coupled by a coupling capacitor 514 to the anode 505 of triode 501 and is also coupled, through resistor 515, to the +100 v. supply. The first output signals appearing on lead 69 are derived directly from the anode 506 of triode 502, and the second output signals appearing on lead 82 are derived directly from the anode 505 of triode 501. Triode 502 is normally maintained conductive by the connection of control grid 513 to the +100 v. supply through resistor 515. Resistors 509 and 510 have values such that the voltage at point 511 or control grid 512 of triode 501 is sufficiently negative with respect to the cathode on point 503 to maintain triode 501 slightly below cutoff in the absence of input signals on lead 5.

The operation of the 1-shot MV 12 in response to positive identification pulses on lead 5, is as follows: a positive pulse appearing at the common junction point 511 drives control grid 512 of triode 501 momentarily sufficiently positive or less negative in respect to the cathode potential at point 503 to induce anode current through triode 501. The sudden conduction of anode current through plate resistor 507 causes a sudden drop in potential at the anode 505 of triode 501. This sudden drop in potential is coupled, by coupling capacitor 514, to the control grid 513 of triode 502 driving the control grid 513 of triode 502 below cutoff. The sudden termination of anode current through triode 502 results in a sudden rise in anode voltage at the anode 506. Triode 502 will remain non-conductive and triode 501 will remain conductive as long as the control grid 513 of triode 502 remains below cutoff. This is determined by the RC time constant of capacitor 514 and resistor 515. The negative charge impressed on capacitor 514 by the sudden rise in anode voltage of triode 501 leaks off through resistor 515 to the +100 v. supply. After a sufficient charge has leaked off capacitor 514 to enable grid 513 to rise above the cutoff level of triode 502, triode 502 will again conduct and triode 501 will return to its non-conductive state. Thus the period or time interval during which the 1-shot MV is in its unstable state after being triggered by a positive pulse depends upon the values of capacitor 514 and resistor 515 as well as on the voltage applied to the multivibrator.

The delayed peaker 16 includes a triode 550, a grid leak resistor 551, a plate load inductor 552, and a diode 553 connected in parallel to the inductor. The cathode of triode 550 is directly grounded and the anode 554 is connected to the +100 v. supply through the plate load inductor 552. Grid 555 is returned through the grid resistor 551 to a −20 v. bias supply, thus providing a fixed negative grid-to-cathode bias just below cutoff tube 550. The complementary signals provided by lead 82 are applied to the grid 555 of triode 550 through a coupling capacitor 556. The anode of diode 553 is connected to the anode 554 of triode 550. Anode 554 of triode 550 is also coupled to the output lead 55 of the ingress-delay signal circuit 39 by a coupling capacitor 557.

A relatively stable steady-state voltage reference level is maintained at the anode 554 of triode 550 by utilizing a plate load inductor 552 having a relatively low resistance and a relatively high inductance. Any rapid change in amplitude of the second output signals appearing on lead 82 appears as a short negative or positive pulse at the grid 555 of triode 550, resistor 551 and capacitor 556 acting as a differentiating circuit. Since the grid 555 of triode 550 is normally maintained below cutoff, negative pulses appearing at the control grid will have no appreciable effect upon the conductivity of triode 550. Consequently, a positive pulse will cause anode current to flow, which, due to the relatively large inductance of inductor 552, appears as a negative voltage spike on the anode 554.

Diode 553 provides a very low impedance return path to the +100 v. supply and thence to ground for positive voltage signals appearing at anode 554, and provides a very high impedance to negative voltage signals developed at the anode 554. Thus a sudden drop in anode current resulting from ringing, overshoot, or spurious current changes in the anode circuit of tube 550 will not appear as a voltage pulse at the anode 554. diode 553 providing a low impedance return path to ground. A sudden rise in anode current, however, resulting from a rapid change of the voltage on lead 82 from a 0 level to a 1 level, will cause a negative pulse to appear at anode 554 which is coupled by a coupling capacitor 557 to the output lead 55.

Thus when the MV 12 is triggered to its unstable state, causing the voltage on lead 82 to drop from the 1 level to the 0 level, no resulting pulse signal is developed on lead 55 by the delay peaker 16. However, when the 1-shot MV 12 returns to its stable state at the end of its unstable state period, the sudden rise from the 0 level to the 1 level of the voltage on lead 82 results in a negative pulse being developed by the delay peaker 16 on lead 55. As previously mentioned, this may be clearly seen by a comparison of the voltage signal on line 82 with the voltage signal on line 55 of the voltage chart of Fig. 2.

Figure 6:
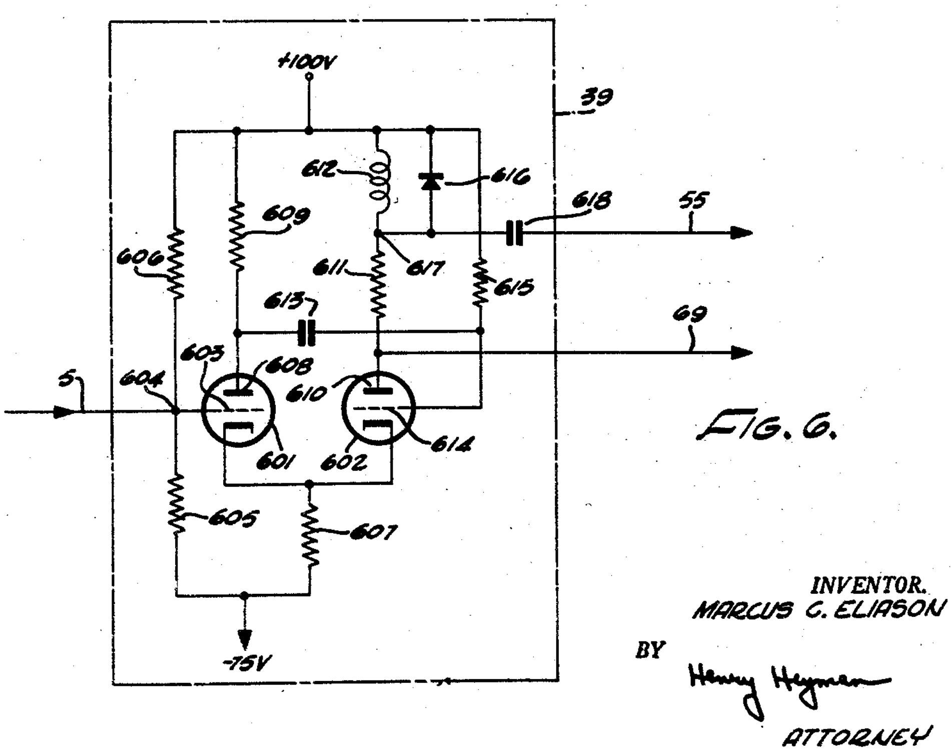
Fig. 6 is a circuit diagram of an alternative embodiment of the ingress-delay signal circuits of the sequence control circuit illustrated in Fig. 1.

Reference is now made to Fig. 6 illustrating an alternative embodiment of the ingress-delay signal circuit 39 of Fig. 1 indicated by broken lines. The circuit of Fig. 6 accomplishes the functions obtained by the ingress-delay signal circuit of Fig. 5 without one of the triodes, thus requiring but two triodes. The ingress-delay circuit of Fig. 6 includes a first triode 601 and a second triode 602. Grid 603 of triode 601 is directly coupled to a common junction point 604 of a voltage divider circuit comprised of resistors 606 and 605 connected in series between a +100 v. source and a −75 v. source. The cathodes of both triodes 601 and 602 are tied together and returned, through a single cathode resistor 607, to the −75 v. supply. Anode 608 of triode 601 is coupled through a plate load resistor 609 to the +100 v. supply, and also coupled, by a coupling capacitor 613, to grid 614 of triode 602. A resistor 611 and an inductor 612 connected in series couple anode 610 of triode 602 to the +100 v. supply. The grid 614 of triode 602 is also connected to the +100 v. supply by a resistor 615. Connected across the inductor 612 is a diode 616, the anode of diode 616 being connected to the common junction point 617 of inductor 612 and resistor 611 and the cathode of the diode being connected to the +100 v. supply. Input lead 5 is connected to the junction point 604 thus impressing the identification pulses directly on grid 603 of tube 601. Output lead 69 is directly connected to the anode 610 of triode 602, and output lead 55 is coupled, by coupling capacitor 618, to the junction point 617.

It will be noted that if the inductor 612 and diode 616 were eliminated from the circuit of Fig. 6 and the common junction point 617 directly connected to the +100 v. supply, the circuit of Fig. 6 becomes identical to the 1-shot MV 12 of Fig. 5. The circuit components of the circuit of Fig. 6 are chosen to have the same values as the corresponding components of the 1-shot MV 12 of Fig. 5. Thus, disregarding for the moment, the inductor 612 and the diode 616, the remainder of the ingress-delay circuit 39 of Fig. 6 operates as a 1-shot MV producing a 1-level and a 0-level output voltage on lead 55 and 69, respectively, when in the stable state and producing a 0-level and a 1-level voltage on lead 55 and lead 69, respectively, when in the unstable state. By adding inductor 612 in the anode circuit of triode 602, any sudden increase or decrease in anode current tends to produce a transient voltage or pulse across inductor 612. By the addition of diode 616 across the inductor, only voltage pulses of one polarity are permitted to develop, current changes tending to produce pulses of the opposite polarity being shunted by the diode. Thus in the present instance, the diode 616 is connected in a manner to shunt positive pulses and permit only negative pulses to appear across the inductor 616. As a result only the negative pulse produced by the sudden fall of anode current of triode 602 as the circuit of Fig. 6 returns from the unstable to the stable state will appear at the junction point 617 and hence be transmitted through the coupling capacitor 618 to output lead 55.

Returning to Fig. 1, the ingress signals developed on leads 69 and 71 by ingress-delay signal circuits 39 and 41 are impressed on the anodes of two diodes 44 and 45, respectively. The cathodes of diodes 44 and 45 are both connected to a common junction point to which lead 66 is connected. Diodes 44 and 45 operate as unilateral coupling elements or gates permitting positive ingress signals to pass from either ingress-delay signal circuit 39 or 41 to lead 66 but isolating or blocking the ingress signals from passing from either one of the ingress-delay signal circuits to the other. Thus the ingress control signals appearing on lead 66 consist of the combined ingress control signals available from lead 69 and 71. This is evidenced by reference to Fig. 2 where the ingress control signals developed by the first and second ingress-delay signal circuits 39 and 41 of Fig. 1 are illustrated on lines 69 and 71, respectively, of the voltage chart, and where the combined ingress control signals appearing on lead 66 are illustrated on line 66. It will be noted that whenever the ingress signals on either line 69 or 71 of the chart are 1-level signals, the ingress signals illustrated on line 66 are 1-level signals.

As indicated in Fig. 1, the sequence control circuit 20 further include busses A, B, C, and D, coupled to diodes 46 to 54, inclusive, and a first, a second, and a third sequential flip-flop 21, 22, and 23, respectively.

The negative delay or triggering pulses developed on leads 55, 56, 57, and 58 by ingress-delay circuits 39, 41, 42, and 43 are directly applied to busses A, B, C, and D, respectively. Thus the first delay pulses appear on bus A, the second delay pulses on bus B, the third delay pulses on bus C, and the fourth delay pulses appear on bus D.

Busses A, B, C, and D are coupled by coupling diodes 46, 47, 48, and 49, respectively, to a common input lead 59 of a first sequential flip-flop 21. Similarly, busses A, C and B, D are coupled by diodes 51, 52, and 53, 54, respectively, to common input leads 61 and 62 of a second and a third sequential flip-flop 22 and 23, respectively. The cathode of each of the diodes 46 to 54, inclusive, is connected to the corresponding bus, the anode of each diode being connected to the corresponding common input lead.

The diodes 46 to 54 are unilateral coupling devices permitting passage of negative pulses in one direction and blocking passage of negative pulses in the other direction. Specifically, each diode permits passage of negative pulses from its cathode to its anode, but inhibits the passage of negative pulses from anode to cathode. Thus the negative pulses appearing on busses A, B, C, and D are passed, by diodes 46 to 49, to lead 59, negative pulses on busses A and C are passed by diodes 51 and 52, to lead 61, and negative pulses on busses B and D are passed, by diodes 53 and 54, to lead 62. This is clearly illustrated in the voltage chart of Fig. 2. For example, the negative pulses illustrated on line 59 are comprised of the combined negative pulses appearing on lines 55, 57, 56, and 58. The negative pulses illustrated on lines 55 and 57 are combined to form the negative pulses appearing on line 61, and the pulses on lines 56 and 58 are combined to form the pulses on line 62.

The output signals of sequential flip-flops 21, 22, and 23 are applied to leads 63, 64, and 65, respectively, and represent the egress or output gate control signals of the first, the second and the third pair of sequential control signals, respectively. Each of the sequential flip-flops 21, 22, and 23 is a conventional bistable flip-flop having two stable states and responsive to the negative delay or triggering pulses for assuming its opposite stable state upon reception of each succeeding pulse on its input lead. A flip-flop of this class is further characterized by developing, at its output, a two-level output voltage having a relatively low or 0-level value when the flip-flop is in one of its stable states and having a relatively high or 1-level value when in its other stable state. For convenience, the stable state of a flip-flop characterized by a 1-level output voltage will hereinafter be referred to arbitrarily as a 1-representing state, and the opposite or 0-level voltage producing state as the 0-representing state.

Thus, if the flip-flop 21 is originally in its 1-representing state, that is, the output voltage level appearing on output lead 63 is a relatively high or 1-level voltage, the succeeding negative pulse appearing on input lead 59 will trigger the flip-flop to its opposite or 0-representing state thus causing a 0-level output voltage to be produced on lead 63. Similarly, flip-flops 22 and 23 are triggered to their opposite stable states in response to each negative pulse appearing on lines 61 and 62, respectively.

Typical flip-flops suitable for operation as the sequential flip-flops 21, 22, and 23 of the present invention are described in detail and illustrated in Fig. 6*a* of U. S. Patent 2,644,887 entitled "Synchronizing Generator" by A. E. Wolfe, issued July 7, 1953. Since such flip-flops are now well known in the art, it is not deemed necessary to illustrate in detail the structural configuration of the sequential flip-flops 21, 22, and 23 of the present invention.

The response of the sequential flip-flops 21, 22, and 23 to negative triggering pulses developed on leads 59, 61, and 62, respectively, is illustrated in the voltage chart of Fig. 2. The stable states of flip-flops 21, 22, and 23 are illustrated in the voltage chart by the corresponding voltage levels of the egress control signals illustrated on lines 63, 64, and 65, respectively. The negative triggering pulses received by flip-flops 21, 22, and 23 are illustrated on lines 59, 61, and 62, respectively. Thus from the chart it is seen that the egress signals appearing on line 63 are changed to the opposite voltage level upon occurrence of each negative pulse appearing on line 59. In a like manner, the egress signals on line 64 assume opposite voltage levels on each occurrence of pulses on line 61, and the egress signals on line 65 change voltage level values in response to each occurrence of pulses on line 62.

As previously mentioned, in typical hyperbolic navigation systems, the transmission sequence of the transmitter stations during each transmission cycle is the same and is here assumed to be in the order of a primary master transmission, a slave No. 1 transmission, a secondary master transmission, and finally a No. 2 slave transmission. A typical transmission cycle of the transmitter stations is illustrated on line 4 of the voltage chart of Fig. 2 wherein the identity of each transmission period is indicated above the pulse signals produced by the corresponding transmitter stations during the transmission period.

For purposes of illustrating the present invention, it is assummed that flip-flop 21 is in the 1-representing state, and that flip-flops 22 and 23 are both in the 0-representing state at the beginning of a transmission cycle. Thus, during the primary master transmission period, the first egress signals have a 1-level, the second egress signals a 0-level, and the third egress signals a 0-level value, as illustrated on lines 63, 64, and 65, respectively, of Fig. 2. Since a negative pulse occurs on line 59 of the chart at the end of each transmission period of a transmission cycle, sequential flip-flop 21 assumes the alternate state, and hence the egress signals appearing on line 63 assume alternate voltage levels, during each succeeding transmission period. More specifically, the egress signals on line 63 have a 1-level value during the primary and secondary master transmission periods and a 0-level value during the slave No. 1 and slave No. 2 transmission periods. Sequential flip-flop 22 is triggered to opposite states at the end of each primary master and slave No. 1 transmission period by the negative pulses illustrated on line 61, and sequential flip-flop 23 is triggered at the end of each secondary master and slave No. 2 transmission period by the negative pulses illustrated on line 62 of the chart of Fig. 2. Thus, the second egress signals available on lead 64 have a 1-level value only during the slave No. 1 transmission periods, and the third egress signals taken from lead 65 have a 1-level value only during the slave No. 2 transmission periods as illustrated on lines 64 and 65, respectively, of the chart. In summary, therefore, the first, second, and third egress signals developed on leads 63, 64, and 65, respectively, of Fig. 2 have 1-level values during the primary and secondary master, the slave No. 1, and the slave No. 2 transmission period, respectively, and 0-level values at all other times.

In order to more clearly visualize the sequential operation of the SAGC system 40 of Fig. 1, the manner in which the input and output gates 24, 25, 26, and 34, 35, 36, respectively, are controlled by the first, second, third, and fourth identification signals developed on leads 5, 6, 7, and 8, respectively, will not be summarized.

Whenever either 1-shot MV 12 or 1-shot MV 13 is in the unstable state, the first ingress control signals developed on lead 66 are 1-level signals causing input gate 24 to be opened permitting passage of the pulse signals from junction point 11 to the energy storage circuit 27. Similarly, input gates 25 and 26 are opened permitting passage of the pulse signals from junction point 11 to energy storage circuits 28 and 29, respectively, when 1-shot MV's 14 and 15, respectively, are in their unstable states.

One-shot MV 12 is triggered to the unstable state by the first identification pulses developed on lead 5, and 1-shot MV's 13, 14, and 15 are triggered to their unstable states by the second, third, and fourth identification pulses developed on leads 6, 7, and 8, respectively.

The first, second, third, and fourth negative delay or triggering pulses developed on leads 55, 56, 57, and 58, respectively, are developed at the end of each unstable state period of 1-shot MV's 12, 13, 14, and 15, respectively. Sequential flip-flop 21 is triggered to its opposite state by either a first, second, third, or fourth delay pulse. Flip-flop 22 is triggered by a first or third delay pulse, and flip-flop 23 by a second or fourth delay pulse.

Whenever flip-flop 21 is in the 1-representing state, output gate 34 is opened by a 1-level egress signal appearing on lead 63. Similarly, a 1-representing state of flip-flop 22 and flip-flop 23 causes output gate 35 and output gate 36, respectively, to be opened.

At the beginning of an operational cycle of the transmitter stations, flip-flop 21 is in its 1-representing state and flip-flops 22 and 23 are both in their 0-representing states. Within an operational cycle, the first identification pulse on lead 5 causes input gate 24 to be opened during reception of the timing pulse of the primary master transmission. The first delay pulse, developed at the end of the primary master transmission period on bus A triggers flip-flops 21 and 22, thus closing output gate 34 and opening output gate 35. Since it has been assumed for purposes of illustration that a slave No. 1 transmission follows a primary master transmission within each operational cycle, the second and third identification pulses are reversed in their order, i. e., a third identification pulse is developed on lead 7 before a second identification pulse appears on lead 6. The third identification pulse provided by lead 7 triggers 1-shot MV 14 to its unstable state thus causing input gate 25 to be opened during reception of the timing pulse of the slave No. 1 transmission. The third delay pulse, developed at the end of the slave No. 1 transmission period on bus C, triggers flip-flops 21 and 22, causing output gate 34 to be opened again and output gate 35 to be closed. The second identification pulse, developed on lead 6 at the end of the code pulses of the secondary master transmission, triggers 1-shot MV 13 to its unstable state thus opening input gate 24 again. The second delay pulse, developed on bus B at the end of the secondary master transmission period, triggers flip-flop 21 to the 0-representing state and flip-flop 23 to the 1-representing state, thus closing output gate 34 and opening output gate 36. The fourth identification pulse, produced on lead 8 during the slave No. 2 transmission period, triggers 1-shot MV 15 to its unstable state and thus causes input gate 26 to be opened. The delay pulse, developed at the end of the slave No. 2 transmission period on bus D, triggers flip-flop 23 to its 0-representing state and flip-flop 21 to its 1-representing state thus closing output gate 36 and opening output gate 34. This completes a typcial operational cycle and leaves all input gates closed, output gate 34 open, and output gates 35 and 36 closed in preparation for the succeeding operational cycle.

The above recited sequence of operations of the SAGC system 40 of Fig. 1 for a complete operational cycle is incorporated in tabular form in Table I below wherein each transmission period of the cycle included in the first or extreme left-hand column; the identification pulses developed by decoder 3 during the cycle are included in the second column from the left; the negative delay or triggering pulses available from the busses A, B, C, and D are included in the third column from the left; the states of the input gates 24, 25, and 26 are included in the second column from the right; and the state of the output gates 34, 35, and 36 are included in the extreme right-hand column. The identification pulses developed on leads 5, 6, 7, and 8 by the decoder 3 are identified in Table I, in the manner previously discussed as the first, second, third, and fourth identification signals, respectively. The input and output gates are identified in conformity with the corresponding reference numerals used in Fig. 1.

*Table I*

| Transmission period | Identification pulses | Delay pulses | Input gates | Output gates |
|---|---|---|---|---|
| Initial states | | | All closed. | 34 opened. 35 closed. 36 closed. |
| Primary master | First | | 24 opened. | |
| | | First-A | 24 closed. | 34 closed. 35 opened. 36 closed. |
| Slave No. 1 | Third | | 25 opened. | |
| | | Third-C | 25 closed. | 34 opened. 35 closed. 36 closed. |
| Secondary master | Second | | 24 opened. | |
| | | Second-B | 24 closed. | 34 closed. 35 closed. 36 opened. |
| Slave No. 2 | Fourth | | 26 opened. | |
| | | Fourth-D | 26 closed. | 34 opened. 35 closed. 36 closed. |

Figure 3:
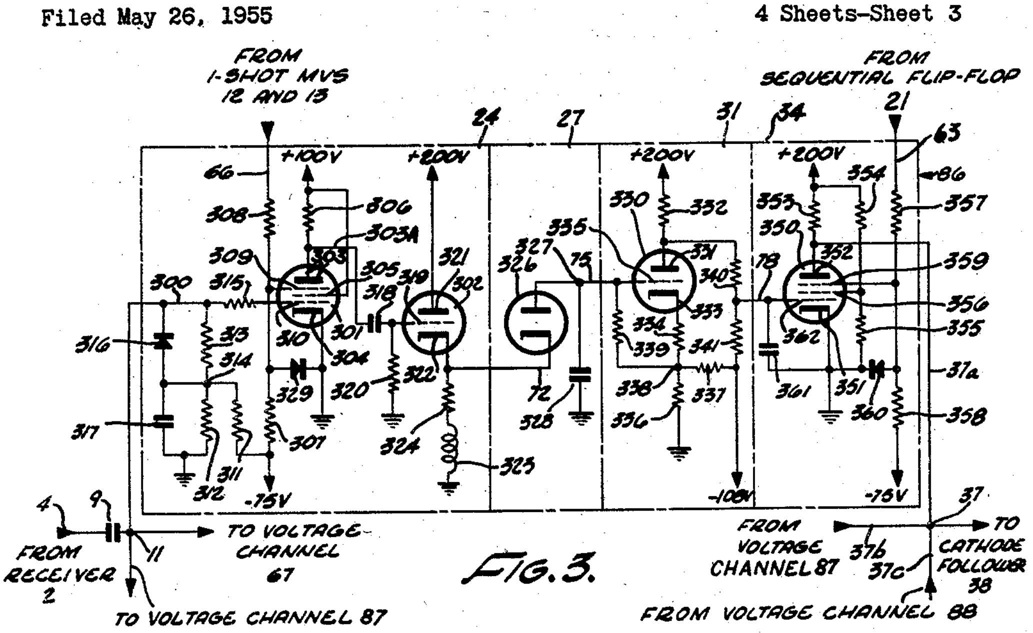
Fig. 3 is a schematic circuit diagram of one voltage channel of the biasing voltage circuit of the SAGC system illustrated in Fig. 1.

Reference is now made to Fig. 3 presenting a circuit diagram of the first voltage channel 86, indicated by broken lines, forming part of the voltage channel circuit 89 of Fig. 1. Since the voltage channels 86, 87, and 88 of the channel circuit 89 are identical, only the first channel 86 will be described in detail.

As indicated in Fig. 3, voltage channel 86 includes an input gate 24, an energy storage circuit 27, a D. C. amplifier 31, and an output gate 34, each indicated by broken lines and representing corresponding parts of the circuit of Fig. 1. Positive pulses developed by receiver 2 are available from lead 4 and are coupled by coupling capacitor 9 to input lead 300. These pulses are selectively gated and reproduced as negative pulses on lead 72 by input gate 24 in response to 1-level ingress control signals developed on lead 66 by 1-shot MV's 12 and 13 of Fig. 1. Energy storage circuit 27, in response to the negative pulses developed on lead 72 by input gate 24, stores the energy contained therein and produces a variable negative voltage on output lead 75 having an amplitude proportional at all times to the energy stored in the energy storage circuit.

Input gate 24 comprises a pentode 301 intercoupled with a triode 302. Pentode 301 includes a cathode 304 connected directly to ground, an anode 303 coupled by plate load resistor 306 to a +100 volt source, a control grid 310 coupled by a grid current-limiting resistor 315 to input lead 300 conected to junction point 11, a screen grid 305 directly connected to the +100 volt source, and a suppressor grid 309 connected to the common junction point of a first voltage divider circuit comprised of series connected resistors 307 and 308. The ingress control signals appearing on input lead 66 are applied to the upper extremity of the first voltage divider circuit 307, 308, the lower extremity of the divider circuit being returned to a −75 volt source. The values of resistors 307 and 308 are chosen so as to establish a negative potential at the suppressor grid 309 of pentode 301 which is below cut-off when the ingress control signals appearing on input lead 66 are 0-level signals, and above cut-off when the ingress control signals are 1-level signals.

The quiescent grid-to-cathode bias applied to control grid 310 is developed by a second voltage divider comprised of resistors 311 and 312 connected in series between the −75 volt source and ground or cathode 304. A resistor 313 provides a return path from control grid 310 through current-limiting resistor 315 to the common junction point 314 of the second voltage divider circuit 311, 312 thus establishing a biasing potential on grid 310 substantially equal to the potential at junction point 314 during the absence of input signals on input lead 300, that is, in the absence of grid current. The values of resistors 311 and 312 are chosen so as to establish a potential on grid 310 sufficiently negative to bias off spurious noise signals and to place the operating level of pentode 301 in a linear portion of its operating characteristic curve, thus providing a class A amplifier circuit.

A diode 316 is connected across the resistor 313, the cathode and anode of the diode being connected to the input lead 300 and the common junction point 314, respectively. A capacitor 317 is connected across resistor 312. The purpose of diode 316 is to shunt unavoidable spurious negative pulses or negative overshoots from lead 300 to ground by way of capacitor 317 which has a sufficiently large capacitance to readily conduct to ground the negative pulses passed by diode 316. Because of the polarity of diode 316, positive pulses appearing on lead 300 are not affected. In order to clamp the screen grid 309 below ground potential, i. e., to prevent the screen grid from becoming positive with respect to the cathode of pentode 301, a clamping diode 329 is connected from the suppressor grid 309 to ground, the anode of the diode being connected to the screen grid and the cathode to ground.

Pentode 303 and its associated circuit, therefore, operates essentially as a gated, class A voltage amplifier for amplifying and inverting the positive input pulses appearing on input lead 300 in response to 1-level ingress control signals on input lead 66.

Triode 302 includes a cathode 322 coupled to ground through a resistor 324 and an inductor 323 connected in series, a control grid 319 referenced to ground by a grid-leak resistor 320, and an anode 321 directly connected to a +200 volt source. The signals developed across pentode load resistor 306 and available from lead 303A are impressed, by coupling capacitor 318, to the control grid 319 of triode 302. Resistor 324 functions as a conventional cathode-bias resistor for establishing a grid-to-cathode negative bias on control grid 319; and inductor 323 provides a highly inductive current path for the anode current of triode 302. Triode 302 and its associated circuit, therefore, functions essentially as a cathode follower for reproducing at a lower impedance level, on output lead 72, the negative pulses obtained from lead 303A.

Energy storage circuit 27 includes a capacitor 328 connected between a terminal point 327 and ground, and a diode 326 connected between the terminal point 327 and the output lead 72 of input gate 24. Lead 75, connected directly to terminal point 327, is the output lead of the energy storage circuit 27.

Diode 326 is utilized as a unilateral coupling device for conducting to terminal point 327 the negative pulses available from lead 72 and developed by input gate 24 but inhibiting the passage of a negative signal from terminal point 327 to lead 72. More specifically, a negative pulse or signal appearing on lead 72 of sufficient magnitude to cause lead 72 to be at a potential negative with respect to the potential at terminal point 327 will cause current flow through diode 326, whereas a negative signal or pulse appearing at terminal point 327 cannot by itself, result in a current flow through the diode.

Capacitor 328 represents a specific embodiment of the energy storage device previously referred to and is charged by the negative pulses or signals coupled from lead 72 to terminal point 327 by diode 326. A relatively high resistance return path to ground for terminal point 327 is provided by the structure of D. C. amplifier 31 having a slow, constant-drain energy leakage path for the negative charge developed in capacitor 328 by the negative pulses or signals appearing at terminal point 327. This energy leakage path will be discussed subsequently. Thus a negative potential is developed across capacitor 328 having an amplitude at any instant proportional to the charge of the capacitor 328 at that instant, where capacitor 328 is charged at a rate proportional to the difference between the energy introduced in the form of negative pulses or signals conducted from lead 72 to terminal point 327 and the energy steadily drained off by the energy leakage path of D. C. amplifier 31.

D. C. amplifier 31 includes a triode 330 and associated circuit connected to form a direct-coupled amplifier for amplifying and inverting the negative voltage signals obtained from lead 75 by the energy storage circuit 27. Triode 330 includes an anode 331 coupled by plate resistor 332 to a +200 v. supply, a grid 335 directly connected to the output lead 75 of energy storage circuit 27, and a cathode 333 coupled by a conventional cathode-bias resistor 334 to a junction point 338 of a voltage divider circuit comprised of resistors 337 and 336 connected between a −108 v. supply and ground. Grid 335 is referenced to the potential of the common junction point 338 of the first voltage divider circuit 336, 337 by connecting grid 335 to the junction point 338 by a conventional grid-leak resistor 339.

The values of resistors 336 and 337 are chosen to maintain the grid 335 normally at a convenient negative potential determined by the size of capacitor 328 and the desired lower threshold negative signal value appearing at terminal point 327 of the energy storage circuit 27. As previously mentioned, D. C. amplifier 31 provides a constant drain energy leak-off for the negative charges developed in capacitor 328. This is provided by resistor 339 to junction point 338 and thence by resistor 336 to ground. The rate of current flow from capacitor 328 to junction point 338 is determined by the difference in potential between junction points 327 and 328, and the value of grid-leak resistor 339. As previously mentioned, the magnitude of the potential at junction point 327 at any instant is proportional to the differential between the rate at which capacitor 328 is charged by the negative pulses impressed on point 327 from lead 72 and the rate of discharge of the capacitor through the constant drain leakage path provided by resistors 339 and 336 in series. By a proper choice of values for capacitor 328 and resistor 339 and an optimum relationship between the voltage divider resistors 336 and 337, a desired balance may be achieved between the rate of charge and the rate of discharge of capacitor 328 for a given reference signal strength of the negative pulses or signals appearing on input lead 72 of the energy storage circuit 27.

The cathode resistor 334 of D. C. amplifier 31 is selected to provide a convenient grid-to-cathode negative bias on triode 330 to avoid cathode-to-grid current flow and to provide linear, class A amplification. The output signals developed across anode resistor 332 of triode 330 are impressed on the upper extremity of a voltage divider circuit comprised of resistors 340 and 341 connected between anode 331 and the the −108 v. supply. The values of resistors 340 and 341 are chosen to provide a convenient reference voltage for the output signals obtained from output lead 78 of the D. C. amplifier 31.

Output gate 34 is similar to input gate 24 in that signals appearing on input lead 78 are substantially reproduced, in an amplified, inverted form, on output lead 37*a* when and only when egress control signals appearing on input lead 63 from sequential flip-flop 21 have a 1-level value. Output gate 34 includes a pentode 350 and associated circuit forming a gated amplifier circuit. Pentode 350 includes a cathode 351 connected directly to ground, an anode 352 coupled to a +200 v. supply by a load resistor 353, a control grid 362 directly connected to input lead 78, a screen grid 356 connected to the junction point of resistors 354 and 355 connected in series between the +200 v. supply and ground to form a voltage divider circuit, and a suppressor grid 359 tied to the common junction point of another voltage divider comprised of resistors 357 and 358 connected in series between input lead 63 and a −75 v. supply.

Control grid 362 is maintained at a slightly negative potential by the voltage divider action of resistors 340 and 341 previously discussed in connection with D. C. amplifier 31. Screen grid 356 is maintained at a convenient positive potential by a proper choice of values for resistors 354 and 355. The values of resistors 357 and 358 are chosen to maintain a potential at suppressor grid 359 sufficiently negative to bias pentode 350 below cutoff. i. e., non-responsive to signals impressed on control grid 362, when the egress control signals appearing on input lead 63 are 0-level signals; but above cutoff when the egress control signals are 1-level signals. Suppressor grid 359 is prevented from attaining a potential above ground by means of clamping diode 360 connected between suppressor grid 359 and ground.

The negative voltage signal developed at terminal point 327 of energy storage circuit 27 by successive negative pulses or signals is of sawtooth form. This is due to the fact that the energy supplied to capacitor 328 by each negative pulse or signal impressed on terminal point 327 by diode 326 partially leaks off or is drained between successive pulses through the constant-drain path provided by resistors 339, 336 in series; each succeeding negative pulse impressed on terminal point 327 again recharging capacitor 328. If the R. C. time constant of the circuit comprised of capacitor 328 and resistors 339, 336 in series were sufficiently large to smooth out or maintain the charge on capacitor 328 relatively constant between successive pulses, the circuit would not have a sufficiently rapid response time to operate effectively in a pulse type AGC system. It is for this reason that a relatively large smoothing capacitor 361 is connected between ground and the control grid 362 of the pentode 350. The response time of the energy storage circuit 27 having been previously established, capacitor 361 may have a sufficiently large value to smooth out the sawtooth waves impressed on lead 78 by D. C. amplifier 31, without in any way affecting the response time of the remainder of the circuit of the voltage channel 36. The output signals of voltage channel 86 appearing on output lead **37*a*, which are directly derived from the anode resistor 353 of pentode 350, are impressed on the common junction 37 from whence they are impressed on the input of the cathode follower 38** of Fig. 1.

Figure 4:
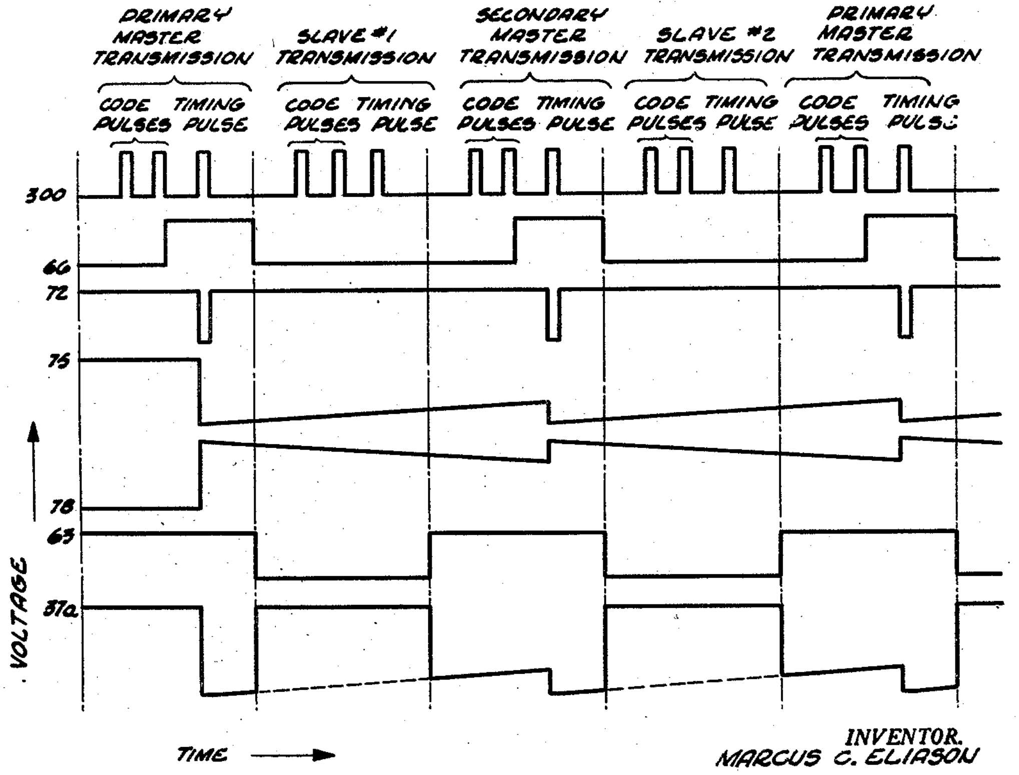
Fig. 4 is a chart of voltage wave forms appearing at various terminals within the voltage channel illustrated in Fig. 3.

Referring to Fig. 4 there is presented a voltage chart of the wave forms appearing on leads 72, 75, 78 and **37*a* of the first voltage channel 86 of Fig. 3, wherein the relative voltage amplitudes of the signals are plotted vertically and time is plotted horizontally. Each voltage signal is designated on the left-hand edge of the chart with a number corresponding to the reference numeral used in Fig. 3 to indicate the corresponding lead on which the voltage signal appears. In addition a reproduction of the voltage output signals developed by receiver 2 on lead 4 of Fig. 1 and illustrated on line 4 of Fig. 2, are reproduced on line 300 of the voltage chart in order to illustrate the time relationship between the various signals appearing on the principal leads of the voltage channel 86 of Fig. 3. Similarly, the ingress and egress control signals appearing on leads 66 and 63 of Fig. 1 and illustrated on lines 66 and 63 of Fig. 2, are reproduced on lines 66 and 63** of the voltage chart of Fig. 4.

The inverted, and thus negative, timing signals appearing on lead 72 of the input gate 24 of Fig. 3 are shown on line 72 of the voltage chart. The negative voltage signals developed by the energy storage circuit 27 and available from lead 75 are illustrated on line 75 of the votlage chart, and the output signals appearing on lead 78 from the D. C. amplifier 31 are shown on line 78 as a mirror image or inverted replica of the signals appearing on line 75. The constituent voltage produced by the voltage channel 86 of Fig. 3 on output lead **37*a* is illustrated on line 37*a*** of the voltage chart of Fig. 4.

Although the voltage signals appearing on lead **37*a* of Fig. 3 are determined by the combined voltages developed by all three of the voltage channels 86, 87, and 88 of Fig. 1, in actual operation, as has been previously discussed in detail, only one of the output gates 34, 35, and 36 is open at any given time. Since Fig. 3 shows voltage channel 86 only, the output signals of voltage channel 86 are illustrated on line 37*a* of Fig. 4 without regard for the voltage signals developed by voltage channels 87 and 88. Thus the voltage signals illustrated on line 37*a* of the chart return to a reference value during the 0-level values of the egress signals appearing on line 63. During the periods that output gate 34 is closed, i. e., when the egress signals on line 63 are 0-level signals, the hypothetical value of the constituent voltage, were the output gate 34 suddenly opened, is indicated by dotted lines superimposed on the voltage signals illustrated on line 37*a*** of the chart.

Disregarding the voltages developed at point 37 by voltage channels 87 and 88, and considering only the voltage developed by channel 86 and appearing on output lead **37*a*, the amplitude of the latter voltage is illustrated on line 37*a* of Fig. 4. The voltage appearing at lead 37*a* and shown in Fig. 4 may be traced in accordance with the states of the input and the output gates 24 and 34, and the voltages appearing across capacitor 328 of the energy storage circuit 27. Thus when the output gate 34 is closed, as characterized by non-conduction of pentode 350, as a result of either an 0-level value of the egress control signals appearing on lead 63 or a sufficiently negative signal appearing on lead 78 due to the absence of a negative charge in capacitor 328, the amplitude of the voltage appearing on lead 37*a* is substantially equal to the amplitude of the anode supply voltage, i. e., +200 v. This represents the reference level above referred to and is illustrated on line 37*a* of Fig. 4 where the upper level of the horizontal sections of the solid line representing the output signals of channel 86** correspond to the reference level of +200 v.

It is assumed that at zero time, as indicated by the vertical broken left-hand line, there is no negative voltage across capacitor 328 and that the ingress control signals appearing on line 63 have a 1-level value. The voltage signal appearing on lead **37*a*, therefore, has an amplitude equal to the reference level from zero time until the first of the gated timing pulses, illustrated on line 72, negatively charges capacitor 328 which, in turn, causes conduction of pentode 350. Thus coincident with the leading edge of the first inverted timing pulse of line 72, the voltage signal of line 37*a* becomes negative as illustrated. As the negative voltage of capacitor 328 gradually dissipates the voltage appearing on lead 37*a*** correspondingly rises exponentially as indicated in the voltage chart.

At the end of the primary master transmission period, as indicated in the chart by the next vertical broken line, the voltage appearing on lead **37*a* returns to the reference level because output gate 34 is now closed by a return to the 0-level value of the egress control signals appearing on lead 63. Had output gate 34 remained opened, the gradual dissipation of the negative potential across capacitor 328 would have determined the amplitude of the voltage appearing on lead 37*a*** which would continue its exponential rise during slave No. 1 transmission period as indicated by the dotted line.

At the beginning of the secondary master transmission period, output gate 34 is again opened, thus causing the voltage appearing on lead **37*a* to drop in amplitude to a value determined by the removing negative charge in capacitor 328 coinciding with the last value indicated by the dotted line illustrating its hypothetical decay during the slave No. 1 transmission period. During the early portion of the secondary master transmission period, the amplitude of the voltage appearing on lead 37***a* will continue to gradually rise in correspondence with the exponential decay of the negative change in capacitor 328. This rise in voltage continues until the second inverted timing pulse illustrated on line 72 recharges capacitor 328 with a negative charge causing the output voltage on lead 37*a* to drop to a corresponding low level coincident with the leading edge of the timing pulse. Following the trailing edge of the timing pulse, the new negative charge on capacitor 328 commences to leak off. The output voltage appearing on lead 37*a* reduces correspondingly until the end of the secondary master transmission period. At the end of the secondary master transmission period, the output gate 34 is closed again causing the output voltage signal to return to its reference-level value. The output signal remains at its reference level until the beginning of the next primary master transmission period, whereupon the cycle of operation repeats.

From the foregoing description it is apparent that the present invention provides a sequential automatic gain control system adapted for operation with a receiving system subject to input signals of varying amplitude from N variously located, co-channel transmitter stations, where N may be any integer greater than 1. It has been demonstrated that the SAGC system described is fully automatic and is admirably suited for operation in conjunction with a receiving system subject to pulse type input signals such as are encountered in hyperbolic navigation systems. It has been further demonstrated that the techniques employed by the present invention provide an extremely rapid-response SAGC system which does not cause signal distortion.

The SAGC system of the present invention has been described as employing the basic technique of generating N corresponding constituent voltages and combining the N constituent voltages sequentially to form a continuous biasing voltage for application to the associated receiving system, where each of the constituent voltages is developed during successive transmission periods of a corresponding one of the N transmitter stations. Means have been described for generating each constituent voltage as a series of cyclic voltage signals, where each cyclic voltage signal of a constituent voltage is generated during a corresponding transmission period of the associated transmitter. It has been clearly demonstrated that by developing each cyclic voltage signal of a constituent voltage with an initial amplitude substantially equal to the final amplitude of the immediately preceding cyclic voltage signal of the same constituent voltage, the necessity for a radically fluctuating biasing voltage is eliminated to compensate for the large variations in input signal strength resulting from the reception, by the receiver, of the sequential transmissions of the N co-channel transmitter stations. In accordance with the invention described, this has been accomplished by developing each of the N constituent voltages across a separate energy storage device in order to substantially preserve the final value of each cyclic voltage signal of a constituent voltage for utilization as an initial value for the next succeeding cyclic voltage signal of the same constituent voltage.

The structure of the SAGC system of the present invention has been described as including a sequence control circuit responsive to the output signals of the associated receiving system for producing N pairs of sequence control signals, and a biasing voltage circuit coupled to the sequence control circuit and responsive to the N pairs of sequence control signals for developing the N corresponding constituent voltages and for combining the N constituent voltages to produce the desired continuously variable biasing voltage. The biasing voltage circuit as described includes N similar voltage channels, each being responsive to the output signals of the receiving system and an associated one of the N pairs of sequence control signals for producing a corresponding one of the N constituent voltages.

An embodiment of the SAGC system of the present invention adapted for operation in conjunction with the receiving system of a three-transmitter hyperbolic navigation system has been described and illustrated in complete detail. In the described and illustrated embodiment of the SAGC system, the biasing voltage circuit includes three voltage channel circuits, each being responsive to an associated one of three pairs of sequence control signals developed by the sequence control circuit of the SAGC system for developing one of three constituent voltages. Since each constituent voltage is developed by the associated voltage channel only during the transmission periods of the corresponding transmitter station, the output signals of all three voltage channels may be combined and impressed on the single input of a cathode follower to produce the desired continuously variable biasing voltage. Each voltage channel includes a separate energy storage device across which the constituent voltage signals of a corresponding one of the three constituent voltages is developed. Each energy storage device may include a capacitor as an energy storage element.

It should be apparent, however, that the energy storage devices used in the storage units of the structure, may equally well consist of any energy storage device capable of storing electrical energy for the short duration of time required by the pulse repetition rate of the timing pulses. For example, inductors represent an admirable substitution for the capacitors.

It is apparent from the foregoing description of the three-station embodiment of the SAGC system of the present invention that the output signals of any receiving system responsive to carrier input signals from any number of sequentially operating transmitter stations may be amplitude stabilized by the described SAGC system. All that is required is the inclusion of a separate voltage channel in the biasing voltage circuit and a separate sequential flip-flop and associated circuit in the sequence control circuit for each sequentially operating transmitting station. Thus if the associated receiving system is responsive to input signals from N sequentially operating transmitter stations, N separate biasing voltage channels and N sequential flip-flops would be required in the biasing voltage circuit and the sequential control circuit, respectively, of the SAGC system.

Insofar as the number of required separate biasing voltage circuits and sequential flip-flops is concerned, the sequence of operation of the transmitter stations is immaterial. For example, it is clear from the foregoing description that for a hyperbolic navigation system incorporating a master transmitter station operating alternately after each transmission period of M sequentially operating slave transmitter stations (M+1) biasing voltage circuits and (M+1) sequential flip-flops are required. In a hyperbolic navigation system employing a master transmitter station and M sequentially operating slave transmitter stations there are 2M transmission periods during each transmission cycle, i. e., M master transmission periods and M slave transmission periods. Hence, 2M ingress-delay signal circuits may be employed within the sequence control circuit of the SAGC system of the present invention.

What is claimed is:

1. A sequential automatic gain control for receiving output signals developed by a radio receiving system subject to N sequentially received carrier transmission signal groups of varying amplitude radiated by N corresponding co-channel transmitter stations, where N is an integer greater than 1 and for developing a biasing voltage for application to the receiving system to maintain substantially constant the amplitude of said output signals; said sequential automatic gain control comprising: first means responsive to the output signals for identifying each of the N sequentially received transmission signal groups and for producing N corresponding pairs of control signals, each of said pairs of control signals being developed during the reception of a corresponding one of said N sequentially received transmission signal groups; second means coupled to said first means and to the receiving system and responsive to the output signals and said N pairs of control signals for producing N corresponding constituent voltages, each of said N constituent voltages being produced when a corresponding one of said signal groups is received; and third means coupled to said second means and responsive to said N constituent voltages for combining said N constituent voltages to produce the desired biasing voltage for application to the receiving system.

2. In an amplitude-stabilized receiving system responsive to pulse-type sequentially recurring input signals, a sequential automatic gain control adapted to receive cyclically recurring output signals produced by the receiving system from the input signals and in response thereto to develop a continuously variable biasing voltage for application to the receiving system; said sequential automatic gain control comprising: first means for receiving the output signals produced by the receiving system for developing pairs of sequence control signals; and second means coupled to said first means and responsive to said pairs of sequence control signals and said output signals for producing the desired continuously variable biasing voltage, said second means including a biasing voltage circuit coupled to said first means and responsive to said pairs of sequence control signals and said output signals for producing constituent voltages, said biasing voltage circuit including a plurality of substantially identical voltage channels, each of said voltage channels being coupled to said first means and responsive to an associated one of said pairs of sequence control signals and said output signals for producing the corresponding one of said constituent voltages, and said second means further including an output circuit coupled to said biasing voltage circuit and responsive to said constituent voltages for combining said constituent voltages, thereby producing said continuously variable biasing voltage.

3. A sequential automatic gain control system adapted to receive output signals developed by a receiving system subject to input signals from N sequentially operated co-channel transmitter stations, where N is an integer greater than 1, and to produce in response thereto a continuously variable biasing voltage for application to the receiving system for regulating the amplification thereof in a manner to maintain substantially constant the amplitude of the output signals irrespective of large variations in the amplitude of the input signals; said sequential automatic gain control system comprising: a sequence control circuit responsive to the output signals developed by the receiving system for producing N pairs of sequence control signals; and a biasing voltage circuit coupled to said sequence control circuit and responsive to said N pairs of sequence control signals and said output signals for producing the desired continuously variable biasing voltage.

4. The sequential gain control system defined in claim 3 wherein said biasing voltage consists of N sequentially combined constituent voltages, and wherein said biasing voltage circuit includes N similar voltage channels, each of said voltage channels being coupled to said sequence control circuit and responsive to a corresponding one of said N pairs of control signals and said output signals for producing a corresponding one of said constituent voltages.

5. The sequential gain control system defined in claim 4, wherein each of said N pairs of sequence control signals is periodically produced by said sequence control circuit during successive transmission periods of a corresponding transmitter station, wherein each of said pairs of sequence control signals includes ingress and egress control signals, and wherein each of said voltage channel circuits includes an input gate, an energy storage circuit, and an output gate, said output gates having a common output terminal, each of said input gates being coupled to an associated energy storage circuit and responsive to the ingress control signals of an associated pair of sequence control signals for selectively gating the output signals from the receiving system into the associated energy storage circuit, each of said energy storage circuits developing a voltage having an amplitude corresponding to the energy stored therein, and wherein each of said output gates is coupled to the associated energy storage circuit and said common output terminal and responsive to the egress control signals of the associated pair of sequence control signals for selectively gating in response thereto the voltage developed by said energy storage circuit to said common output terminal, thereby producing said constituent voltages at said output terminal.

6. The sequential gain control system defined in claim 5 wherein each of said energy storage circuits includes a capacitor for storing the signal gated into the energy storage circuit.

7. The sequential gain control system defined in claim 5 wherein said biasing voltage circuit further includes a cathode follower connected to said common output terminal and responsive to said constituent voltages for impressing said constituent voltages on the receiving system.

8. The sequential gain control system defined in claim 5 wherein said sequence control circuit includes $(N+1)$ ingress-delay signal circuits responsive to the output signals for producing said ingress control signals and for producing $(N+1)$ corresponding delay signal groups, and wherein said sequence control circuit further includes N bistable flip-flops coupled to said $(N+1)$ ingress-delay signal circuits and responsive to said $(N+1)$ delay signal groups for producing said egress control signals, each of said flip-flops developing a corresponding one of said egress control signals.

9. The sequential gain control system defined in claim 8 wherein said sequence control circuit includes a plurality of uni-lateral coupling devices and one of said flip-flops is coupled by $(N+1)$ of said coupling devices to all of said $(N+1)$ ingress-delay signal circuits and responsive to all of said $(N+1)$ delay signal groups for producing a corresponding one of said N egress control signals.

10. In a receiving system responsive to pulse-modulated carrier signals from N co-channel transmitter stations, N being any integer greater than 1, for producing demodulated pulse output signals and for producing N corresponding station identification signal groups, an automatic gain control system coupled to the receiving system and responsive to the pulse output signals and the station identification signal groups for producing a continuous bias voltage for application to the receiver to control the amplification of the receiver, said automatic gain control system comprising: a sequence control circuit responsive to the station identification signal groups for producing N pairs of sequence control signals, each pair of sequence control signals being produced in response to a corresponding one of said station identification signal groups; and a biasing voltage circuit coupled to said sequence control circuit and responsive to said pairs of sequence control signals and the demodulated pulse output signals for producing the continuous biasing voltage.

11. In an amplification-stabilized hyperbolic navigation receiving system including a receiver for intercepting pulse-modulated carrier signals from N sequentially operating transmitter stations, N being any integer greater than 1, each transmitter station producing code-pulse modulated carrier signals and timing pulse-modulated carrier signals during each transmission period of the station, said receiver being adapted to demodulate and amplify the carrier signals to produce code and timing pulse output signals, and a decoder coupled to the receiver and responsive to the code pulse output signals from the receiver for producing N station identification signals, each station identification signal being produced during a transmission period of a corresponding transmitter station; an automatic gain control system coupled to the receiver and the decoder and responsive to the timing pulse output signals from the receiver and the station identification signals from the decoder for producing a continuously variable biasing voltage for application to the receiver to stabilize the amplification of the receiver in a manner to produce pulse output signals of substantially constant amplitude, said automatic gain control system comprising: a sequence control circuit responsive to the station identification signals for producing N pairs of sequence control signals, each pair of sequence control signals being produced in response to a corresponding one of the station identification signals; a biasing voltage circuit coupled to said sequence control circuit and the receiver, and responsive to said sequence control signals and the timing pulse output signals for sequentially producing N constituent biasing voltages, each constituent biasing voltage being produced during each transmission period of a corresponding one of the transmitter stations, and each constituent biasing voltage having an initial amplitude at the beginning of each transmission period of the associated transmitter station substantially equal to the final amplitude of the constituent voltage during the immediately preceding transmission period of the associated transmitter station; and an output circuit coupled to said biasing voltage circuit and responsive to said constituent biasing voltages for sequentially combining said constituent voltages to produce the continuously variable biasing voltage.

12. In a sequential automatic gain control system responsive to output signals from a receiving system adapted to intercept signals from N sequentially operating transmitter stations, where N is any integer greater than 1, and for producing N corresponding constituent voltages which are combined to form a single, continuously variable biasing voltage for application to the receiving system, N identical voltage channels responsive to the output signals from the receiving system and responsive to N pairs of sequence control signals for producing the constituent voltages, each pair of sequence control signals being produced during successive transmission periods of a corresponding one of the transmitter stations and including ingress and egress control signals, each of said voltage channels including: an energy storage circuit for storing the energy of the output signals of the receiving system and developing an output voltage having an amplitude proportional at all times to the energy stored therein; an input gate coupled to said energy storage circuit and the receiving system and responsive to the output signals from the receiving system and the ingress control signals of a corresponding pair of sequence control signals for selectively gating said output signals to said energy storage circuit; a direct-coupled amplifier coupled to said energy storage circuit and responsive to the output voltage of the energy storage circuit for amplifying said output voltage; and an output gate coupled to said amplifier and responsive to the amplified voltage obtained from said amplifier and the egress signals of the corresponding of sequence control signals for selectively gating said amplified voltage to produce a corresponding one of the constituent voltages.

13. The voltage channel defined in claim 12 wherein said energy storage circuit includes a capacitor for storing the energy of the output signals and for developing said output voltage.

14. In a sequential automatic gain control system for controlling the amplification of a receiving system responsive to groups of input signals from a master transmitter station and M sequentially operating slave co-channel transmitter stations, where M is any integer, a sequence control circuit coupled to the receiving system and responsive to 2M station identification signals developed by the receiving system identifying the transmitter station of origin of each group of input signals for producing $(M+1)$ pairs of sequence control signals, each pair of said sequence control signals being developed during the transmission periods of a corresponding transmitter station and including ingress control signals and egress control signals: 2M ingress-delay signal circuits responsive to the station identification signals for developing 2M ingress signals and 2M delay signals, each of said ingress-delay signal circuits being responsive to a corresponding station identification signal for developing corresponding ones of the ingress and delay signals; coupling means for combining said 2M ingress signals developed by said ingress-delay circuits for producing $(M+1)$ ingress control signals: $(M+1)$ sequential bistable flip-flops coupled to said ingress-delay signal circuits and responsive to said delay signals for producing $(M+1)$ egress control signals, each of said flip-flops being responsive to at least two of said delay signals and producing a corresponding one of said egress control signals.

15. In a sequential automatic gain control system for controlling the amplification of a radio receiving system responsive to pulse-type input signals transmitted during successive transmission periods from a radio transmitter station, an ingress-delay signal circuit responsive to station identification signals developed by the receiving system identifying the transmitter station for producing binary ingress control signals and delay pulses, said ingress-delay signal circuit producing 1-level ingress control signals during each transmission period and producing delay pulses at the end of each transmission period; said ingress-delay signal circuit comprising: a monostable multivibrator responsive to the station identification signals for producing the binary ingress control signals and complementary second binary output signals, said monostable multivibrator having a stable state and a quasi-stable state and producing said second binary output signals having a 1-level value during the stable state and a 0-level value during the quasi-stable state; and a delayed peaker coupled to said monostable multivibrator and responsive to said second binary output signals for producing the delay pulses, said delayed peaker producing a delay pulse each time the second binary output signals change from a 0-level value to a 1-level value, and said delayed peaker including an amplifier circuit responsive to the second binary output signals for producing an amplified inverted replica thereof on its output circuit, and an inductor coupled to the output circuit of said amplifier circuit and responsive to the amplified inverted output signals for producing the delay pulses.

References Cited in the file of this patent

UNITED STATES PATENTS

| | | |
|---|---|---|
| 2,422,334 | Bedford | June 17, 1947 |
| 2,562,309 | Frederick et at. | July 31, 1951 |
| 2,545,924 | Johnstone | Mar. 20, 1951 |
| 2,588,924 | Hecht | Mar. 11, 1952 |
| 2,589,240 | Frye | Mar. 18, 1952 |
| 2,608,651 | Emmett, Jr. | Aug. 26, 1952 |
| 2,724,829 | Eugley et al | Nov. 22, 1955 |
| 2,732,549 | Frantz | Jan. 24, 1956 |

FOREIGN PATENTS

| | | |
|---|---|---|
| 581,603 | Great Britain | Oct. 18, 1946 |

UNITED STATES PATENT OFFICE
CERTIFICATE OF CORRECTION

'atent No. 2,863,046 December 2, 1958

Marcus C. Eliason

It is hereby certified that error appears in the printed specification of the above numbered patent requiring correction and that the said Letters Patent should read as corrected below.

Column 23, line 42, for "36." read -- 86. --; column 27, line 10, after "said" insert -- N --.

Signed and sealed this 10th day of March 1959.

(SEAL)
Attest:

KARL H. AXLINE
Attesting Officer

ROBERT C. WATSON
Commissioner of Patents